(12) United States Patent
Bang et al.

(10) Patent No.: US 10,274,741 B2
(45) Date of Patent: Apr. 30, 2019

(54) DISPLAY FOR PERSONAL IMMERSION APPARATUS

(71) Applicant: LG DISPLAY CO., LTD., Seoul (KR)

(72) Inventors: Hyungseok Bang, Goyang-si (KR);
Seungman Ryu, Paju-si (KR);
Jonggeun Yoon, Gunpo-si (KR);
Yongku Lee, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/582,009

(22) Filed: Apr. 28, 2017

(65) Prior Publication Data

US 2017/0315372 A1    Nov. 2, 2017

(30) Foreign Application Priority Data

Apr. 29, 2016    (KR) .................. 10-2016-0053568

(51) Int. Cl.
*G02B 27/22*    (2018.01)
*H04N 13/344*    (2018.01)
(Continued)

(52) U.S. Cl.
CPC ....... *G02B 27/2242* (2013.01); *G02B 3/0037* (2013.01); *G02B 27/0081* (2013.01); *G02B 27/0172* (2013.01); *G09G 3/3208* (2013.01); *H01L 27/326* (2013.01); *H01L 27/3244* (2013.01); *H01L 27/3293* (2013.01);
(Continued)

(58) Field of Classification Search
CPC .. A44B 17/007; A44B 17/0076; F16M 13/04; G06F 3/16; H04R 1/028; H04R 1/1066; H04R 2499/15; G02B 27/0081; G02B 27/0172; G02B 27/2242; G02B 3/0037; G09G 3/3208; H01L 27/3293; H01L 51/5275; H01L 51/5284; H01L 2251/5315; H01L 27/3244; H04N 13/344
See application file for complete search history.

(56) References Cited

U.S. PATENT DOCUMENTS 8,582,209 B1 * 11/2013 Amirparviz .......... G02B 3/0056
359/630
2010/0278480 A1 * 11/2010 Vasylyev ............... G02B 3/005
385/33
2014/0078274 A1 * 3/2014 Kroon .................. H04N 13/305
348/59

FOREIGN PATENT DOCUMENTS

JP        2013-205749 A     10/2013
KR   10-2013-0048477 A      5/2013
(Continued)

*Primary Examiner* — Nelson M Rosario
(74) *Attorney, Agent, or Firm* — Seed Intellectual Property Law Group LLP

(57) ABSTRACT

The present disclosure relates to a display for a personal immersion apparatus for embodying the virtual reality or the augmented reality. The present disclosure suggests a display for a personal immersion apparatus comprising: a display panel; and an imaging lens; wherein the display panel includes: a plurality of pixel areas disposed on a substrate; an emission area defined in the each pixel area; a non-emission area surrounding the emission area in the each pixel area; and a micro deflector configured to deflect lights scattered over the non-emission area from the emission area to a normal direction with respect to a surface of the substrate, and to provide the deflected lights to the imaging lens, and wherein the imaging lens is disposed apart from the display panel with a focal length of the imaging lens.

20 Claims, 18 Drawing Sheets

(51) Int. Cl.
*G02B 3/00* (2006.01)
*G02B 27/00* (2006.01)
*G09G 3/3208* (2016.01)
*H01L 27/32* (2006.01)
*H01L 51/52* (2006.01)
*G02B 27/01* (2006.01)

(52) U.S. Cl.
CPC ....... *H01L 51/5275* (2013.01); *H04N 13/344* (2018.05); *H01L 51/5284* (2013.01); *H01L 2251/5315* (2013.01)

(56) References Cited

FOREIGN PATENT DOCUMENTS

| | | |
|---|---|---|
| KR | 10-2014-0014684 A | 2/2014 |
| KR | 10-2016-0021650 A | 2/2016 |
| WO | 2012/164425 A1 | 12/2012 |

* cited by examiner

DISPLAY FOR PERSONAL IMMERSION APPARATUS

BACKGROUND

Technical Field

The present disclosure relates to a display for a personal immersion apparatus for virtual reality or augmented reality. In particular, the present disclosure relates to a display for a virtual reality device having enhanced the sense of real (or, 'real interactivity') by removing the screen door effect.

Description of the Related Art

Virtual reality (VR) or augmented reality (AR) has been defined as a realistic and immersive simulation of a three-dimensional environment. To provide the virtual reality, the VR (virtual reality) apparatus is developed for generating the realistic images, sounds and other sensations that replicate a real environment (or create an imaginary setting), and simulate a user's physical presence in this environment. The VR apparatus (or, 'personal immersion apparatus') are applied to various fields including the fields of defense, architecture, tourism, films, multi-media and games.

The VR apparatus is a device providing a replicated real environment to a specific person. In the VR apparatus, the display is the most important part for presenting the visual reality. For example, the HMD (Head Mounted Display), the FMD (Face Mounted Display) and the EGD (Eye Glasses-type Display) are the typical display adapted for the VR apparatus. Hereinafter, we may call the display for VR apparatus as a 'VR display' or 'display for personal immersion apparatus'.

Currently, the goggle type VR apparatus has prevailed because it is easy for a person to take on and off. However, for enhancing the degree of visual reality or the stereoscopic property, the display should be more developed. Further, when using for a long time with the low quality of visual reality, dizziness or fatigue may become a problem for many users.

For one example, the smart phone can be used for the VR display in which the smart phone is equipped into a HIVID frame and the virtual video is represented on the smart phone. However, as the display of the smart phone is not optimized for the VR display, it is hard to provide the high quality of the visual reality. Further, due to other necessary devices such as battery, this system is too heavy to use as the VR display for a long time.

SUMMARY

In order to overcome the above mentioned drawbacks, the present disclosure provides a display for a virtual reality apparatus that enhances the three-dimensional quality and the immersion quality and reduces the fatigue associated with using a virtual reality apparatus for a long period of time. Another aspect of the present disclosure provides a display of a virtual reality device that enhances the stereoscope, the reality and the immersion properties by removing the screen door effect.

In one or more embodiments, the present disclosure provides a display for a personal immersion apparatus comprising: a display panel; and an imaging lens; wherein the display panel includes: a plurality of pixel areas disposed on a substrate; an emission area defined in the each pixel area; a non-emission area surrounding the emission area in the each pixel area; and a micro deflector configured to deflect lights scattered into the non-emission area from the emission area to a normal direction with respect to a surface of the substrate, and to provide the deflected lights to the imaging lens, and wherein the imaging lens is disposed apart from the display panel with a focal length of the imaging lens.

In one embodiment, the emission area is provided to the imaging lens as a magnified image by the micro deflector, and the non-emission area is provided to the imaging lens as a scaled-down image by the micro deflector.

In one embodiment, the micro deflector includes: a minimum rim apart from an edge line of the emission area toward the emission area with a first distance; and a maximum rim apart from the edge line of the emission area toward the non-emission area with a second distance.

In one embodiment, wherein the maximum rim of the micro deflector is at least set on a middle line between the edge line of the emission area and a neighboring edge line of a neighboring emission area, and slightly apart from the middle line with a predetermined distance.

In some embodiments, the micro deflector includes: a first micro deflector disposed at a middle portion of the substrate; and a second micro deflector at a circumferential portion of the substrate, wherein a first center point of the first micro deflector is aligned to a first center point of a first emission area, and wherein a second center point of the second micro deflector is aligned to an extended line from the second center point of a second emission area to a corresponding point on the imaging lens.

The present disclosure provides a display for a personal immersion apparatus including a display panel having a plurality of micro-deflector disposed at the non-emission area. Some lights radiated from the emission area are scattered in the non-emission area so that they are not detected or observed by the user in front of the display. The micro-deflector reflects or deflects the lights to the front direction so that the lights can be observed by the user. As the results, the areas of the emission area would be enlarged while the areas of the non-emission area would be reduced. Therefore, even though the area ratio of the emission area in the real pixel area is not changed, the area ratio of the emission area in the observed video image is increased. In the video image recognized to the user, the screen door effect would be removed or minimized. The display for a personal immersion apparatus according to the present disclosure provides the maximized reality and immersion properties.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

In the drawings.

DETAILED DESCRIPTION

Figure 1:
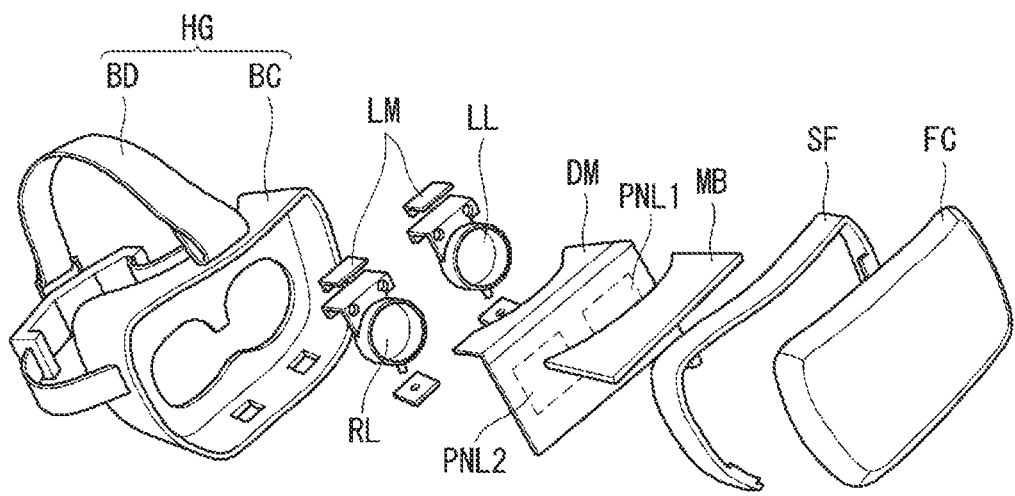
FIG. 1 is a perspective view illustrating the structure of a display for a personal immersion apparatus according to one or more embodiments of the present disclosure.

Referring to attached figures, one or more preferred embodiments of the present disclosure will be described. Like reference numerals designate like elements throughout the detailed description. However, the present disclosure is not restricted by these embodiments but can be applied to various changes or modifications without changing the technical spirit of the disclosure. In the following embodiments, the names of the elements are selected by considering the easiness for explanation so that they may be different from actual names.

<First Embodiment>

FIG. 1 is a perspective view illustrating the structure of a display for a personal immersion apparatus according to embodiments of the present disclosure.

Referring to FIG. 1, a display for a personal immersion apparatus (or, 'VR display') comprises a lens module LM, a display module DM, a main board MB, a head gear HG, a side frame SF and a front cover FC.

The display module DM includes display panels and a display panel driving circuit for driving each display panel to represent the video images received from the main board MB. The display panel includes a first display panel PNL1 for the left eye of a user and a second display panel PNL2 for the right eye of the user. The display module DM is configured to show the video data received from the main board MB on the first and the second display panels PNL1 and PNL2. The video data may be the 2D/3D video data for representing video image of the virtual reality (or VR) or the augmented reality (or AR). The display module DM may show information received from the main board MB as text, symbol or image (picture).

The lens module LM includes a imaging lens that enlarges and provides the image screens for the left eye and/or the right eye to cover the viewing range of the left and the right eyes of the user. The imaging lens may include a pair of fisheye lens, a kind of a super wide-angle lens (or, pantoscope) for enlarging the viewing range of the image. A pair of the fisheye lenses may include a left lens LL disposed in front of the first display panel PNL1 and a right lens RL disposed in front of the second display panel PNL2.

The main board MB may include a processor for executing a virtual reality software program and providing the left eye image and the right eye image to the display module DM. Even though it is not shown in figures, the main board MB may further include an interface module, a sensor module and so on for connecting to one or more exterior devices. The interface module may include at least any one of the universal serial bus (or 'USB') and the high definition multimedia interface (or 'HDMI'). The sensor module may include at least any one of the gyroscopic sensor and the accelerometer sensor.

Responding to the output signal of the sensor modules, the processor of the main board MB may compensate the left eye images and the right eye images and transmit the left video data and the right video data received via the interface modules to the display module DM. The processor may create the left images and the right images for the display panel based on the depth data of the 2D images and transmit them to the display module DM.

The head gear HG may include a back cover BC exposing some center portions of the left eye lens LL and the right eye lens RL corresponding to the user's eyes and a band BD connected to the back cover BC. Assembling the back cover BC of the head gear HG with the side frame SF and the front frame FC, the inner space can be ensured for housing most of all elements of the personal immersion apparatus and for protecting them. These elements may include the lens module LM, the display module DM and the main board MB. The band BD may be connected to the back cover BC. Using the band BD, the user can wear the personal immersion apparatus on his/her head. Wearing the personal immersion apparatus, the user sees the first and the second display panels PNL1 and PNL2 through the left and the right fisheye lenses LL and RL, respectively.

Fixed between the head gear HG and the front cover FC, the side frame SF may ensure the inner space (or gap) in which the lens module LM, the display module DM and the main board MB are disposed or installed. The front cover FC may be disposed on the front outer surface of the personal immersion apparatus.

The personal immersion apparatus according to the present disclosure may be designed with the head mounted display (or 'HMD') structure as shown in FIG. 1, but it is not restricted to only such a structure. For other example, the personal immersion apparatus according to the present disclosure may be designed with the eye glasses type display (or 'EGD') structure.

Figure 2:
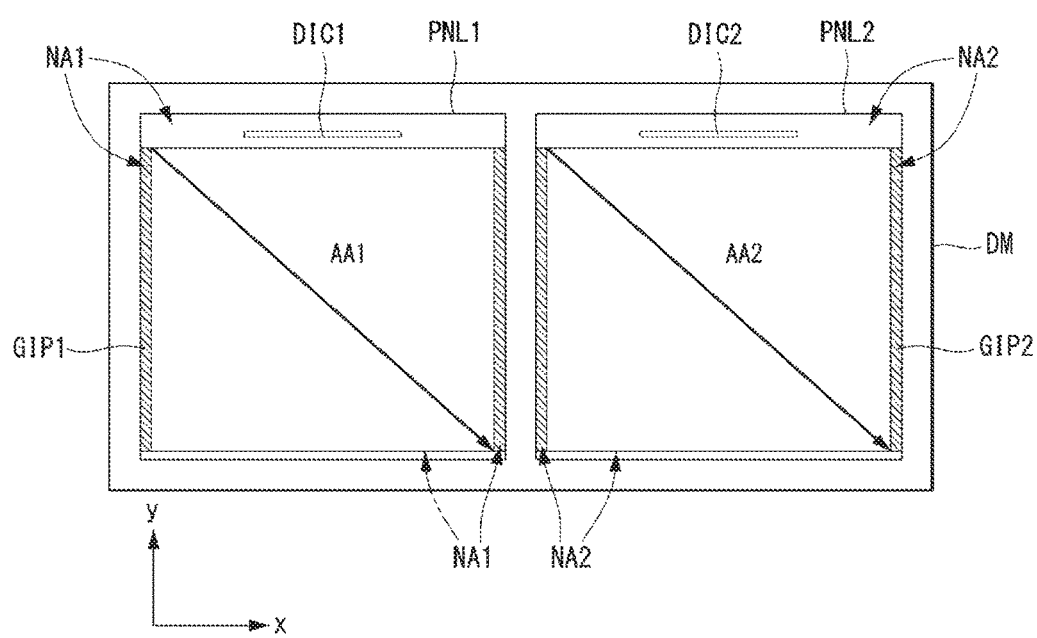
FIG. 2 is a plane view illustrating the first display panel and the second display panel of the display module in FIG. 1 according to embodiments of the present disclosure.
Figure 3:
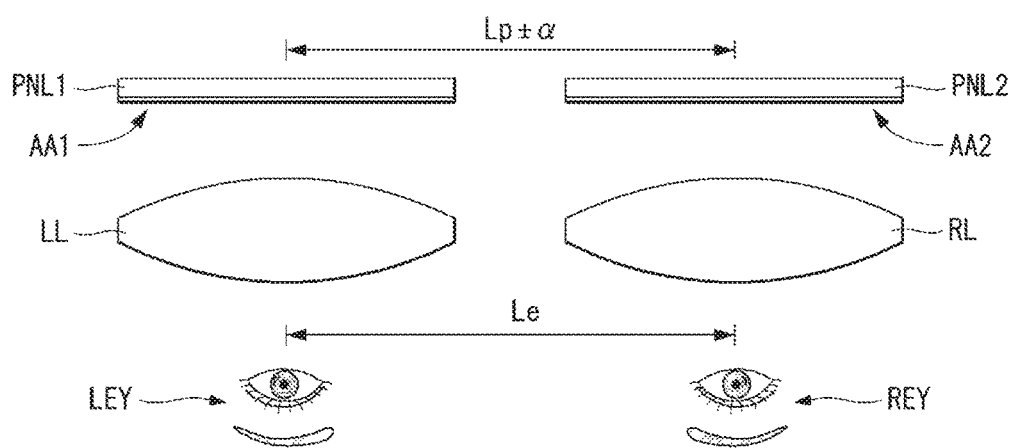
FIG. 3 is a plane view illustrating a distance between the first display panel and the second display panel shown in FIG. 2 according to embodiments of the present disclosure.

FIG. 2 is a plane view illustrating the first display panel PNL1 and the second display panel PNL2 of the display module DM in FIG. 1. FIG. 3 is a plane view illustrating a relationship of the first display panel PNL1, the second display panel PNL2 and the lenses LL and RL shown in FIG. 2 and the left and the right eyes of the user.

The first and the second display panels PNL1 and PNL2 may be organic light emitting diode display (or, 'OLED') panels having superior color representability, high reactive speed and a wide viewing angle. For EGD type, the display panels PNL1 and PNL2 may have the transmittance organic light emitting diode display panels. However, embodiments of the present disclosure are not restricted to such display panel types. Any other type of flat display panel including the liquid crystal display panel and/or the electrophoresis panel may be used.

Referring to FIG. 2 and FIG. 3, the first and the second display panels PNL1 and PNL2 are separate panels disposed with a predetermined distance between them on the display module DM. Each of the first and the second display panel PNL1 and PNL2 has a display area and a non-display area. For example, the first display panel PNL1 includes a first display area AA1 disposed in the center portions and a first non-display area NA1 surrounding the first display area AA1. The second display panel PNL2 also includes a second display area AA2 in the center portions and a second non-display area NA2 surroundings the second display area AA2.

In the first and the second display areas AA1 and AA2, a plurality of pixels is disposed in a matrix manner. At the first and the second non-display areas NA1 and NA2, the driving circuits are disposed for driving the pixels in the display areas. For example, the driving circuits may include a driver integrated circuit (or 'DIC') and a gate in panel (or 'GIP').

The DIC may be an integrated circuit having a timing controller and the data driver. The GIP may be an integrated circuit including a gate driver and an emission (or 'EM') driver disposed on the same substrate with the pixels (or 'pixel array'). On the first display panel PNL1, the first DIC DIC1 and the first GIP GIP1 are disposed within the first non-display area NA1 for providing the left video images to the pixels in the first display area AA1. On the second display panel PNL2, the second DIC DIC2 and the second GIP GIP2 are disposed within the second non-display area NA2 for providing the right video images to the pixels in the second display area AA2.

It is preferable that the center point of the first display area AA1 of the first display panel PNL1 and the center point of the second display area AA2 of the second display panel PNL2 are spaced apart from each other with a distance corresponding to the distance between the left eye and the right eye, the inter pupillary distance (or 'IPD') Le. For example, the distance Lp between the center point of the first display area AA1 and the center point of the second display area AA2 may be set as (Le±α). Being various according to the human race, the inter pupillary distance Le may be 6.5 cm (=65 mm). Further, the value of α is a marginary value for considering the manufacturing process margin and the driving circuit area disposed between the first display area AA1 and the second display area AA2. The value of α may be set at 10% of Le.

Considering the vertical viewing angle and the horizontal viewing angle, the first display area AA1 and the second display area AA2 may be designed as having a landscape aspect ratio in which the horizontal (X-axis) width is longer than the vertical (Y-axis) height. For the personal immersion apparatus, when ensuring wider horizontal viewing angle than the vertical viewing angle, the visual reality can be more effectively enhanced. In order to maximize the horizontal viewing angle for the personal immersion apparatus, each of the first and the second display panels PNL1 and PNL2 may include the landscape type OLED panel in embodiments of the present disclosure.

For the landscape aspect ratio, the length of the horizontal (X-axis) direction (i.e., width) is longer than the length of the vertical (Y-axis) direction (i.e., height), and the number of the pixels disposed along the horizontal (X-axis) direction is larger than the number of the pixels disposed along the vertical (Y-axis) direction. On the contrary, for a portrait aspect ratio, the length of the vertical (Y-axis) direction (i.e., height) is longer than the length of the horizontal (X-axis) direction (i.e., width), and the number of the pixels along the vertical (Y-axis) direction is larger than the number of the pixels along the horizontal (X-axis) direction.

The inventors of the present disclosure have executed quality tests with various models of the display panels for comparing the stereoscopic feeling, immersion feeling and fatigue. According to the results of these tests, the best immersion quality is achieved when the display areas AA1 and AA2 of the display panels PNL1 and PNL2 are disposed with a distance corresponding to the inter pupillary distance, as shown in FIG. 3. In detail, the personal immersion apparatus may suggest the best video quality of the viewing angle and immersion feeling, when the display areas AA1 and AA2 of the display panels PNL1 and PNL2 are separated and the distance between the center points of them is corresponding to the distance between the left eye LEY and the right eye REY of the user. For the personal immersion apparatus according to the present disclosure, the center point of the first display area AA1 would be aligned with the center of the left eye LEY and the center point of the second display area AA2 would be aligned with the center of the right eye REY.

Comparing with the portrait aspect ratio, the landscape aspect ratio may provide better stereoscopic feeling for the personal immersion apparatus. According to embodiments of the present disclosure, the landscape type left eye display panel and the landscape type right eye display panel are disposed as separately aligning to the left eye and the right eye, respectively so that superior immersion and stereoscopic effect is achieved.

In order to separate the first display area AA1 representing the left eye image from the second display area AA2 representing the right eye image, the first and the second display areas AA1 and AA2 may be disposed on individual substrates, respectively. In that case, the first display area AA1 may be disposed on the first display panel PNL1 and the second display area AA2 may be disposed on the second display panel PNL2. Here, the first display panel PNL1 and the second display panel PNL2 may be separately or individually manufactured.

For another example, the first and the second display areas AA1 and AA2 may be disposed on the same substrate but disposed separately. In this case, on one same display panel, the first and the second display areas may be separately disposed. In detail, the data line, the gate line (or scan line) and the pixels for the first display area may be separated from the data line, the gate line and the pixels for the second display area. In this case, even though the first and the second display area are separated each other, the same driving system may be used so that the some portions of the driving circuit may be commonly used.

Disposing the first display area AA1 and the second display area AA2 separately on the one same display panel, it may suggest further merits except the superior stereoscopic feeling. In some cases, the personal immersion apparatus has one display area disposed on one display panel, and the left eye image and the right eye image are displayed separately. In that case, the pixel arrays are not separated, but the left and right video images are separately represented. Comparing with this case, the present disclosure has different point that the display areas AA1 and AA2 are separately disposed.

Due to this difference, the present disclosure may have more degrees of freedom for design of the display area. Disposing the display areas AA1 and AA2 aligned to the left eye LEY and the right eye REY, respectively, it may ensure the optimized viewing angle and the superior stereoscopic feeling. Further, for the structure of the display panel according to embodiments of the present disclosure, the area of the display area may be optimized and minimized so that the manufacturing yield and/or the productivity may be enhanced.

When the distance between the display areas AA1 and AA2 is getting narrower, the screen size which the user can be recognized becomes smaller. Contrary, when the distance between the display areas AA1 and AA2 is getting wider, the center points of the display areas AA1 and AA2 move out of the viewing range of the user's left and right eyes LEY and REY so that the immersion and stereoscopic feelings become somewhat degraded. When the center points of the display areas AA1 and AA2 are exactly aligned with the center of the left eye LEY and the right eye REY, respectively, the best immersion and stereoscopic feelings would be acquired.

When the distance between the center points of the display areas AA1 and AA2 is too narrowed or widened, it is possible to compensate the viewing angle by using additional optical means or to adjust the distance between the left eye image and the right eye image to the inter pupillary distance of user by using any image process methods. However, these methods may cause a deterioration of the display effect. Briefly, by separating the display areas AA1 and AA2 and aligning the center points of the display areas AA1 and AA2 to the left eye LEY and the right eye REY, respectively, the best quality of the 3D image would be provided.

The personal immersion apparatus includes the fisheye lenses LL and RL between the display panels PNL1 and PNL2 and the eyes LEY and REY of user. The distances from the eyes LEY and REY to the display panels PNL1 and PNL2 are very short, e.g., within a few centimeters. Disposing the display panels PNL1 and PNL2 as being close to the eyes LEY and REY, the video images are provided so as to be wider than the viewing range of the eyes. Therefore, the user feels the video images are the same as the actual space.

Just disposing the display panel as being close to the eyes, the user may not recognize what are the video images, because it is same situation in which the user sees the picture just in front of his/her eyes. Further, the circumferences of the display panel may be recognized so that the reality of the video image would be degraded. To provide the reality of the 3D images, it is preferable that the imaging lens such as the fisheye lenses LL and RL would be disposed between the display panels PNL1 and PNL2 and the eyes LEY and REY of user, respectively.

As seeing the video images provided on the display panel through the imaging lenses, the user may recognize 4-5 times enlarged images than the real size of the images. Under this situation, when the resolution of the display panel is low, the user may recognize the shape of the pixel so that the reality and immersion may be degraded. Therefore, it is preferable that the display for the personal immersion apparatus has the high resolution property.

Since the resolution of the display panel may vary depending on the manufacturer or the application field, it may be defined as follows. The table 1 shows one example of the resolution based on the HD (High Definition) rate of 1280×720 pixels.

TABLE 1

| Resolution of Display Panel | Numbers of Pixel (Horizontal Axis × Vertical Axis) |
| --- | --- |
| 1K (HD: High Definition) | 1280 × 720 |
| 2K (FHD: Full HD) | 1920 × 1080 |
| 3K (QHD: Quadra HD) | 2560 × 1440 |
| 4K (QHD) | 3840 × 2160 (or, 4096 × 2160) |
| 8K (UHD: Ultra HD) | 7680 × 4320 |

Here, the resolution is defined with letter 'K'. K means 1,000. For example, 1K means the resolution in which the numbers of the pixel along the horizontal axis is about 1,000. 2K means the resolution in which the numbers of the pixel along the horizontal axis is about 2,000. 4K means that the numbers of the pixel along the horizontal axis is about 4,000. 8K means that the numbers of the pixel along the horizontal axis is about 8,000. The exact resolutions represented by FHD, QHD and UHD may be slightly deferent depending on the manufacturer so that these are written in parentheses as the references.

With the same resolution, the pixel size would be different according to the size of the display panel. For 2K resolution, the size of one pixel for a 2.5 inch display panel is substantially smaller than the size of one pixel for a 5 inch display panel. Therefore, for ensuring the reality of the display of the personal immersion apparatus, the pixel density should be further considered. The pixel density is represented with units of PPI (Pixel Per Inch) which means the numbers of the pixels per inch along the horizontal axis.

For example, for the 5 inch display panel having 1K resolution, the length of the horizontal axis is 4 inches so that the pixel density along the horizontal axis is 250 PPI. When the 5 inch display panel has 2K resolution, the pixel density is 500 PPI. On the other hand, for the case of a 2.5 inch display panel having 1K resolution, the length of the horizontal axis is 2 inches so that the pixel density is 500 PPI. When the 2.5 inch display panel has 2K resolution, the pixel density is 1,000 PPI.

To ensure the high reality and immersion properties, the display panel for the personal immersion apparatus would have the high resolution and small pixel size enough not to be recognized by user's sight even though the display panel is disposed close to the user's eyes. It is preferable that each display areas AA1 and AA2 of the first and second display panels PNL1 and PNL2 have the 2K resolution and the 500 PPI pixel density, at least.

The video image represented on the display areas would be provided to the eyes of the user as being enlarged by the imaging lenses. In the display areas, a plurality of the pixels is arrayed in a matrix manner. The display area includes the emission area and the non-emission area. The emission area is defined at the middle portions of one pixel, as for representing the color and/or brightness of the image data. The non-emission area is the black area not providing any lights in one pixel surrounding the emission area.

When display area is enlarged by the imaging lens, the emission area and the non-emission area are enlarged. Therefore, the screen door effect is caused. The screen door effect is that the non-emission areas are recognized by user as the black mesh lines disposed between each emission areas. The screen door effect is one of main defects for reducing the sense of reality and/or immersion of 3D images.

Figure 4A:
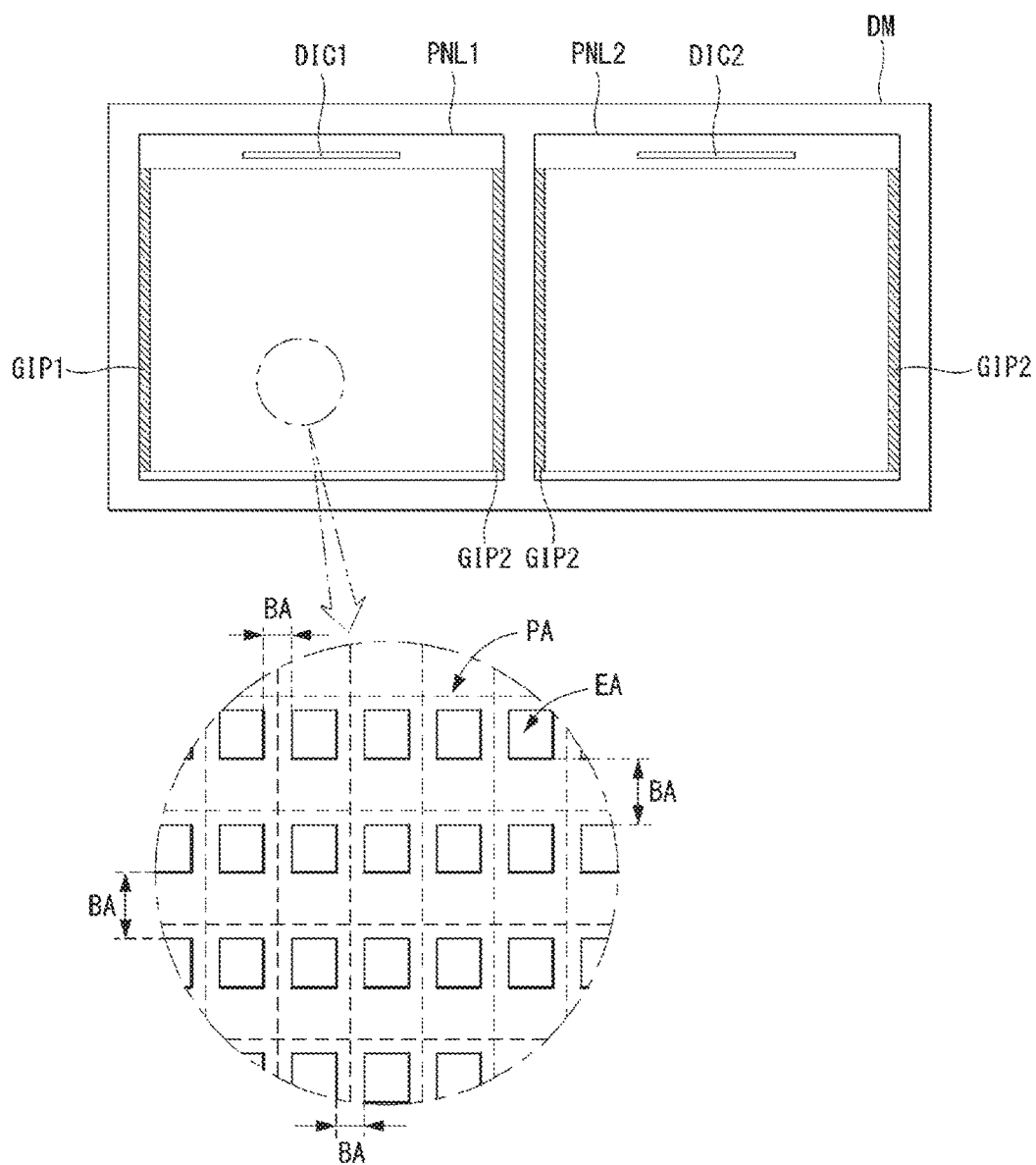
FIG. 4A is a plane view illustrating an enlarged display area of an organic light emitting diode display panel according to embodiments of the present disclosure.
Figure 4B:
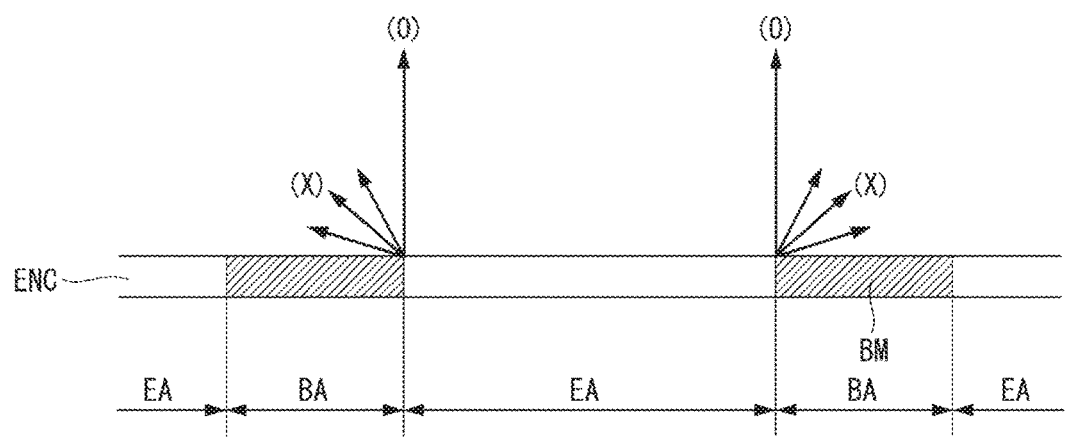
FIG. 4B is a cross sectional view illustrating the light path provided to a user from the organic light emitting diode display panel.

Referring to FIGS. 4A and 4B, the screen door effect will be explained in detail. FIG. 4A is a plane view illustrating an enlarged display area of an organic light emitting diode display panel according to embodiments of the present disclosure. Referring to FIG. 4A, the organic light emitting diode display panel comprises a plurality of the pixel area PA arrayed in a matrix manner. The pixel area PA includes an emission area EA and a non-emission area BA. The emission area EA may be defined in the middle of the pixel area PA, and the non-emission area BA may surround the emission area EA.

In the emission area EA, an organic light emitting diode is formed as stacking an anode electrode, an organic light emitting layer and a cathode electrode, sequentially. In the non-emission area BA, the thin film transistors and the lines are disposed for driving the organic light emitting diode. The pixel area PA may be different according to the types of the organic light emitting diode display panel. The aperture ratio, the area ratio of the emission area EA for the pixel area PA, is about 10%~20%.

Referring to FIG. 4B, we will explain about the light path from the display panel PNL to the imaging lens LEN. FIG. 4B is a cross sectional view illustrating the light path provided to a user from the organic light emitting diode display panel.

The display panel PNL includes an emission area EA and a non-emission area BA. All lights provided from the emission area EA may radiate all directions to the front of the display panel PNL. For example, at the boundary between the emission area EA and the non-emission area BA, the lights radiate and/or scatter all directions. The user recognizes lights linearly propagated from the display panel PNL to the eyes among the lights scattered all directions. In the figures, the scattered lights which do not reach to the user, or that are not typically recognized by the user, are marked with (x). The directly propagated lights to the user's eye are marked with (o).

For the organic light emitting diode display panel, the area ratio of the non-emission area BA to the pixel area PA is larger than other flat panel display such as the liquid crystal display panel. In the case that the organic light emitting diode display panel is applied to the display of the personal immersion apparatus, due to the enlarged non-emitting area, the sense of the reality and/or immersion may be degraded. That is, the user may recognize the images like that the image is seen through a mesh screen (i.e., the screen door effect). In order to reduce the screen door effect, it is preferable that the aperture ratio of the organic light emitting diode display panel would be larger than 20%.

It is very hard to ensure the high aperture ratio. Especially, when the display panel has pixel density of 500 PPI or more, the size of the pixel area PA would be very small. It is very hard that the area ratio of the non-display area BA to the pixel area is proportionally reduced as the pixel area is reduced. There is a limitation for reducing the sizes of the lines and the thin film transistors disposed in the non-emission area. As being smaller of the pixel size, the reducing ratio of the emission area EA would be much larger than the reducing ratio of the non-emission area BA.

In order to enhance the sense of the reality and immersion from the display of the personal immersion apparatus, the high density display panel may be required. As increasing the pixel density, the aperture ratio is getting lowered, so that the screen door effect is increased. In the present disclosure, we suggest a display panel for the personal immersion apparatus in which the aperture ratio is maintained over 20% and the screen door effect is removed even though the display panel has 2K resolution or higher up to 4K or 8K.

Figure 5A:
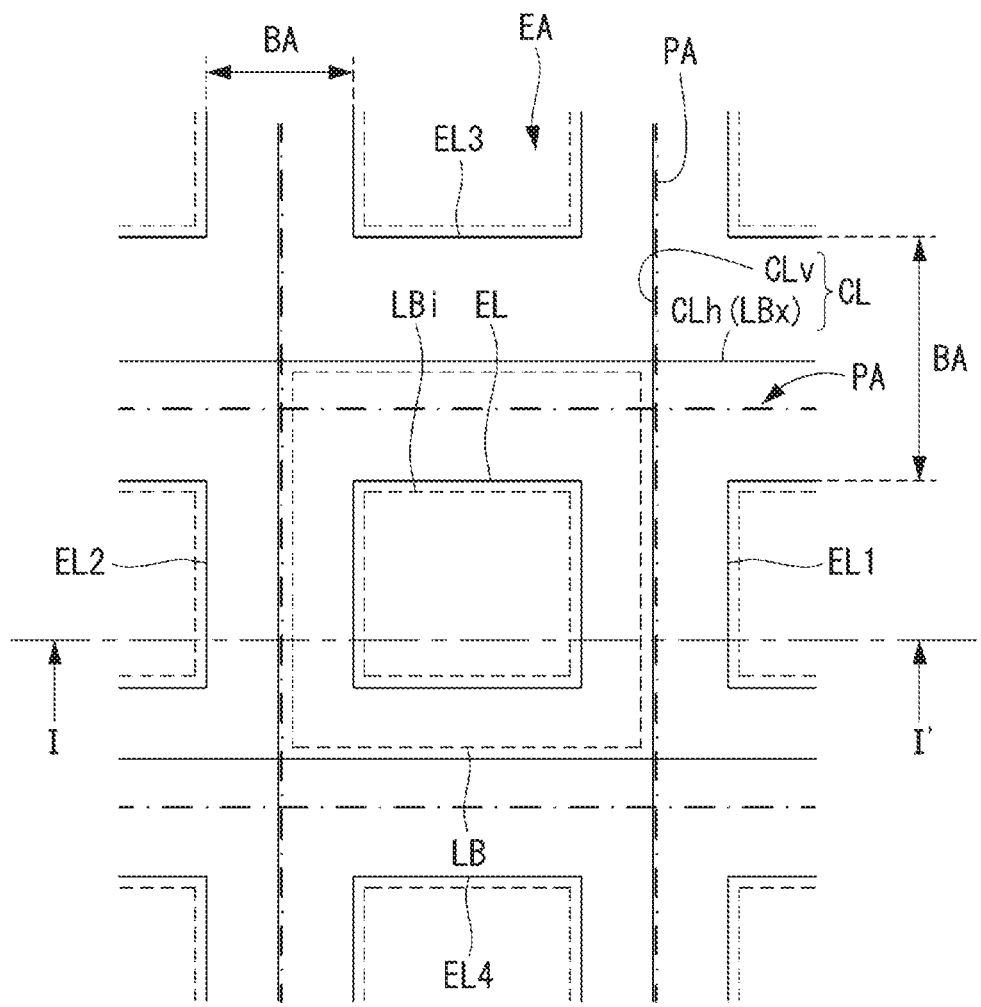
FIG. 5A is an enlarged plane view illustrating a structure of a display panel for a personal immersion apparatus, according to a first embodiment of the present disclosure.
Figure 5B:
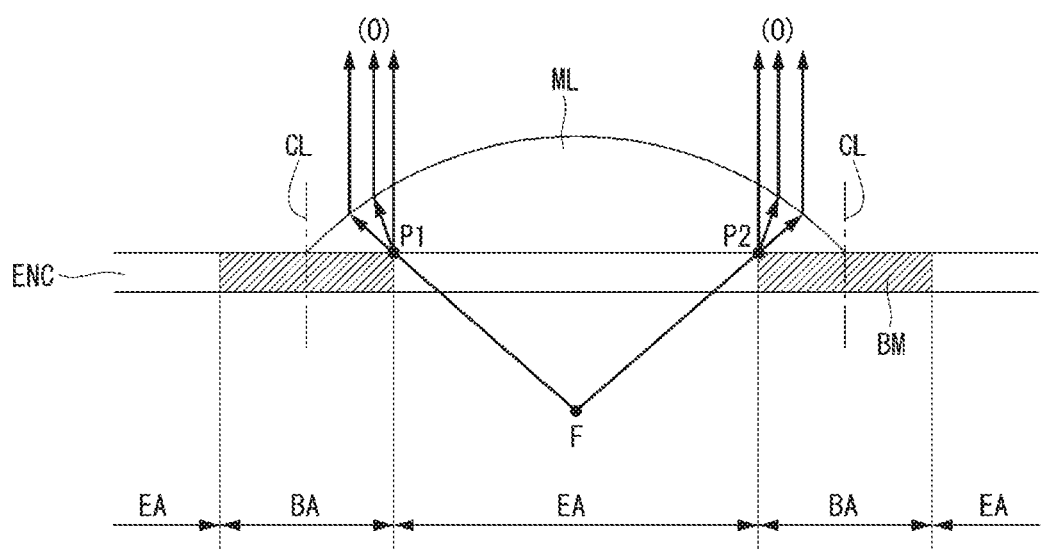
FIG. 5B is an enlarged cross sectional view illustrating a structure of a display panel for a personal immersion apparatus, cutting along line I-I' in FIG. 5A, according to the first embodiment of the present disclosure.

Hereinafter, referring to FIGS. 5A and 5B, we will explain about the display panel for the personal immersion apparatus according to the first embodiment of the present disclosure. FIG. 5A is an enlarged plane view illustrating a structure of a display panel for a personal immersion apparatus, according to the first embodiment of the present disclosure. FIG. 5B is an enlarged cross sectional view illustrating a structure of a display panel for a personal immersion apparatus, cutting along to line I-I' in FIG. 5A, according to the first embodiment of the present disclosure.

Referring to FIG. 5A, a display panel for a personal immersion apparatus according to the first embodiment of the present disclosure comprises a plurality of pixel areas PA arrayed in a matrix manner on a substrate SUB. In FIG. 5A, one rectangular shape defined by the dot-dash line is corresponding to one pixel area PA. One pixel area PA includes an emission area EA and a non-emission area BA. The emission area EA is for generating lights of any one of the red color, the blue color and the green color. The non-emission area BA is disposed between emission areas EA, and does not provide any lights. The non-emission area BA is for preventing color lights from the neighboring emission areas EA from interfering with each other, so it would be called a black matrix.

The emission area EA is disposed at the middle portions of the pixel area PA. In some cases, the emission area EA may be disposed at portions biased toward any side. FIGS. 5A and 5B show that the emission area EA is biased toward an upper side of the pixel area PA. Between the emission areas EA, the non-emission area BA is disposed as depositing/coating of a black material.

At one pixel area PA, at least one micro deflector ML is disposed. It is preferable that the micro deflector ML is disposed at the side where the lights are radiated at the emission area EA. It is preferable that the micro deflector ML has a larger size than the size of the emission area EA to cover all of the emission area EA and some portions of the non-emission area BA. Further, the edge boundary of the micro deflector ML is aligned to a middle area between facing edges of the neighboring two emission areas EA, or is apart from the middle area with some distance. In other words, it is preferable that the area of the micro deflector ML is larger than the emission area EA and is equal to or slightly smaller than the pixel area PA.

We explain about the relationship between the emission area EA and the micro deflector ML in detail. A plurality of the emission areas EA is disposed on the substrate SUB in a matrix manner. Each emission area EA has the boundary, the edge line EL. One emission area EA is surrounded by 4 neighboring emission areas EA. The edge line EL of any one emission area EA is facing with other edge lines EL of the neighboring emission areas EA. For example, the edge line EL of one emission area EA faces with the first neighboring edge line EL1 the second neighboring edge line EL2, the third neighboring edge line EL3 and the fourth neighboring edge line EL4.

The center line CL may be defined at the middle portion between the edge line EL of any one emission area EL and the neighboring edge lines EL1, EL2, EL3 and EL4 of the neighboring emission areas EA. In FIGS. 5A and 5B, the horizontal center lines CLh are defined between the edge line EL of one emission area EA and the third neighboring edge line EL3 and between the edge line EL of one emission area EA and the fourth neighboring edge line EL4, respectively. The vertical center lines CLv are defined between edge line EL of one emission area EA and the first neighboring edge line EL1 and between the edge line EL of one emission area EA and the second neighboring edge line EL2, respectively. In this case, the vertical center line CLv is substantially equal to the dot-dash line defining the pixel area PA. In order to distinguish the vertical center line CLv from the pixel area PA, the vertical center line CLv is drawn as being shifted to left side from the dot-dash line.

It is preferable that the micro deflector ML has a larger size than the area surrounded by the edge line EL of the emission area EA. Therefore, it is preferable that the rim LB of the micro deflector ML is defined between the edge line EL of the emission area EA and the center line CL.

The micro deflector ML is an element configured to deflect and/or refract the scattered lights into the non-emission area BA among the lights radiated from the emission area EA to the normal direction with respect to the surface of the display panel PNL. Therefore, it is preferable that the portion configured to deflect and/or refract among the micro deflector ML is disposed between the minimum rim LBi defining the minimum size of the micro deflector ML and the maximum rim LBx defining the maximum size of the micro deflector ML. The minimum rim LBi may be defined as being apart from the edge line EL of the emission area EA into the emission area EA with a predetermined distance. The maximum rim LBx may be defined as substantially being same with the center line CL. Here, the distance which the minimum rim LBi is apart from edge line EL of the emission area EA is preferably 5%~10% of the distance from the edge line EL of the emission area EA to the rim LB of the micro deflector ML.

Further, referring to FIG. 5B, we will explain how the micro deflector works according to the first embodiment of the present disclosure. FIG. 5B is a cross-sectional view enlarging one pixel area.

The micro deflector ML is disposed as covering the pixel area PA including the emission area EA and the non-emission area BA. The micro deflector ML may be any one of a convex lens and a prism. Here, for convenience, the micro deflector ML is drawn as a convex lens. It is preferable that the micro deflector ML has a prism shape at the surface over the non-emission area BA.

The lights radiated from the emission area EA to the normal direction of the surface are recognized by a user. Further, some of the lights scattered to the space over the non-emission area BA from the emission area EA are refracted to the normal (or vertical) direction with respect to the surface of the display panel PNL by the micro deflector ML. That is, some of the lights that does not reach the user's eyes located in front of the display panel PNL when the micro deflector ML is not included would be redirected to the user's eyes by the micro deflector ML.

When the micro deflector ML is a convex lens, it has a focal point (or focus) F. The lights emitted in a range within the inner angle formed by the lines connecting the focal point F and both end points P1 and P2 of the light emitting area EA, respectively, would be refracted or deflected to the normal direction with respect to the surface of the display panel by the micro deflector ML. As the focal point F being closer to the micro deflector ML (or, as the focus being shorter), more lights within wider angle range among the lights radiated from the emission area EA may be refracted to the normal direction.

In some cases, the micro deflector ML may be a multi lens having a multifocal point. In these cases, more portions among the lights scattered within the space over the non-emission area BA may be refracted or deflected to the normal direction (or to the user's eye).

Figure 6:
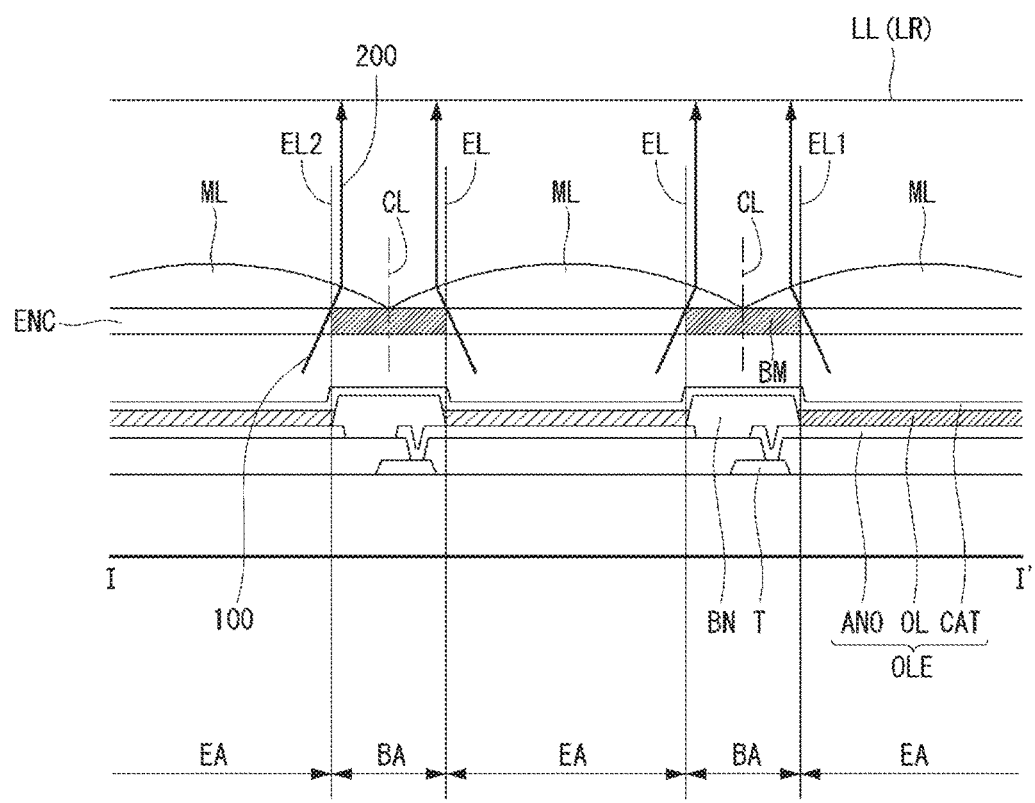
FIG. 6 is a cross sectional view illustrating a structure of a display panel for a personal immersion apparatus, cutting along line I-I' in FIG. 5A, according to the first embodiment of the present disclosure.

Hereinafter, referring to FIG. 6, we will explain about the cross sectional structure of the display panel for the personal immersion apparatus according to the first embodiment of the present disclosure in detail. FIG. 6 is a cross sectional view illustrating a structure of a display panel for a personal immersion apparatus, cutting along line I-I' in FIG. 5A, according to the first embodiment of the present disclosure. The display panel for the personal immersion apparatus according to the first embodiment is described as including an organic light emitting diode display; however, as mentioned above, other types of displays may be utilized in accordance with embodiments of the present disclosure. On a substrate SUB, lines and a thin film transistor T are formed in the non-emission area BA. In the emission area EA, an organic light emitting diode OLE is formed. The organic light emitting diode OLE includes an anode electrode ANO connected to the thin film transistor T, an organic light emitting layer OL stacked on the anode electrode ANO and a cathode electrode CAT stacked on the organic light emitting layer OL.

On the anode electrode ANO, a bank BN is formed for defining the emission area EA. The covered area by the bank BN is defined as the non-emission area BA and the exposed area of some of the anode electrode ANO from the bank BN is defined as the emission area EA.

An encapsulate (or "encap") ENC is joined on the upper surface of the substrate SUB having the organic light emitting diode OLE. On the upper surface of the encap ENC, a micro deflector ML having the convex lens is disposed. It is preferable that the micro deflector ML has a larger area than the emission area EA and covers all areas of the emission area EA. Further, it is preferable that the micro deflector ML covers a larger area as much as possible. For convenience, in FIG. 6, the black matrix BM is shown disposed at the area corresponding to the non-emission area BA, but it is not restricted to this structure.

Specifically, it is preferable that the micro deflector ML is disposed at the non-emission area BA. In the case that the micro deflector ML is a convex lens, it is preferable that the center portion of the convex is located at the emission area EA, the circumference portion of the convex (or edge portions of the micro deflector ML) is located at the non-emission area BA. It is preferable that the rim of the micro deflector ML is aligned to the center line CL setting at the middle between the neighboring two boundaries of two neighboring emission areas EA, or to the position apart from the center line CL with a predetermined distance.

By the micro deflector ML, the scattered lights 100 radiated into the space over the non-emission area BA are changed into the radiated lights 200 refracted to the normal direction with respect to the surface of the display panel. In detail, among the lights emitted from the organic light emitting layer OL, the normal lights radiated vertically from the substrate SUB reach to the user's eye. In addition, the radiated lights 200 redirected from the scattered lights 100 also reach to the user's eye.

As a result, the user may recognize the display panel as that the emission area EA is magnified and the non-emission area BA is scaled-down by the micro deflector ML. Here, the actual size of the emission area EA is not enlarged and the actual size of the non-emission area BA is not reduced. The image of the emission area EA is magnified and the image of the non-emission area BA is scaled-down.

As shown in FIG. 6, the image of the display panel incident into the imaging lens LL and RL has the structure in which the emission area EA has larger viewing area ratio to the pixel area PA than the actual aperture ratio. In FIG. 6, the imaging lenses are shown in flat surface, as they may be seen as having a flat surface in the enlarged drawings even though the imaging lenses LL and RL are the fisheye lenses. For example, for the case of the display panel with 15% of aperture ratio, the viewing area ratio of the emission area EA would be 50% magnified. Therefore, it is the same with the display panel having 22.5% of the aperture ratio. In other words, with further disposing the micro deflector ML on the display panel having high pixel density, the aperture ratio would be magnified 1.5 times or more. Consequently, as removing or controlling the screen door effect, the display panel for the personal immersion apparatus according to the first embodiment of the present disclosure improves the sense of the reality and immersion.

Hereinbefore with the first embodiment, we explain about the features of the whole structure of the display panel for the personal immersion apparatus. Hereinafter, we will explain about the structure and shape examples of the micro deflector ML.

<Second Embodiment>

Hereinafter, we will explain about the structure and the function of the micro deflector according to the present disclosure. In the first embodiment, we explained about the micro deflector ML which is embodied with using a convex lens, one of the most easily formed element. According to a purpose and intention of the designer, the micro deflector may have various shapes and structures.

A main feature of the micro deflector ML according to embodiments of the present disclosure is to provide a method and/or device configured to redirect the lights which may be extincted out at the non-emission area BA into the normal direction with respect to the surface of the display panel. Most of the elements included in the display panel have the materials of which refraction index is larger than air. Therefore, it is preferable that the micro deflector has a transparent material of which refraction index is very similar with that of the other elements included in the display panel.

With a convex lens as explained in the first embodiment, the shape of the lens type micro deflector may be various according to the shapes and arrangement of the emission area EA. For example, when the emission area has a regular polygon or a circle, a symmetric micro lens would be applied for the micro deflector ML.

Figure 7A:
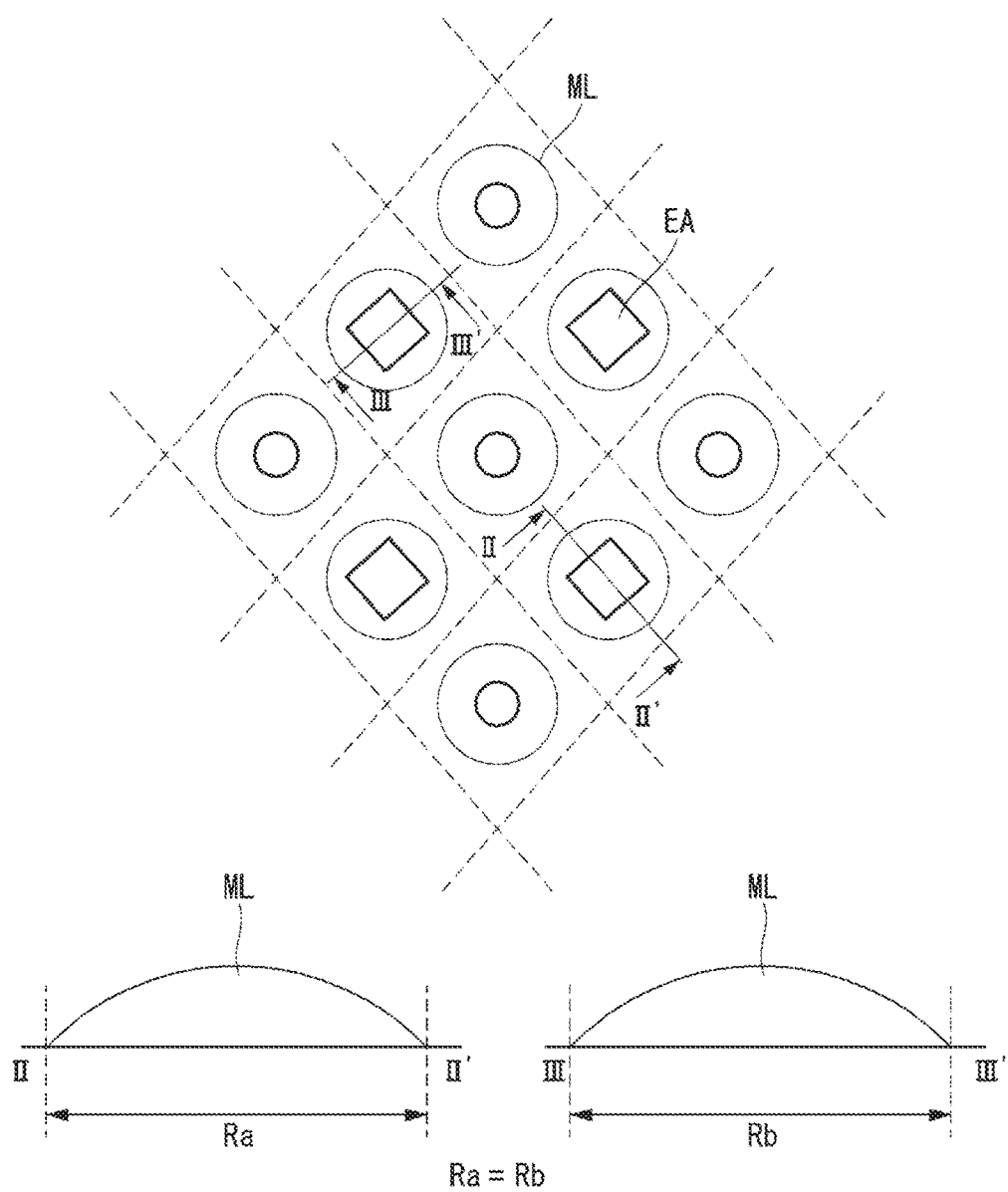
FIGS. 7A and 7B are drawings illustrating the shape of the micro deflector disposed on the display panel for a personal immersion apparatus, according to a second embodiment of the present disclosure.
Figure 7B:
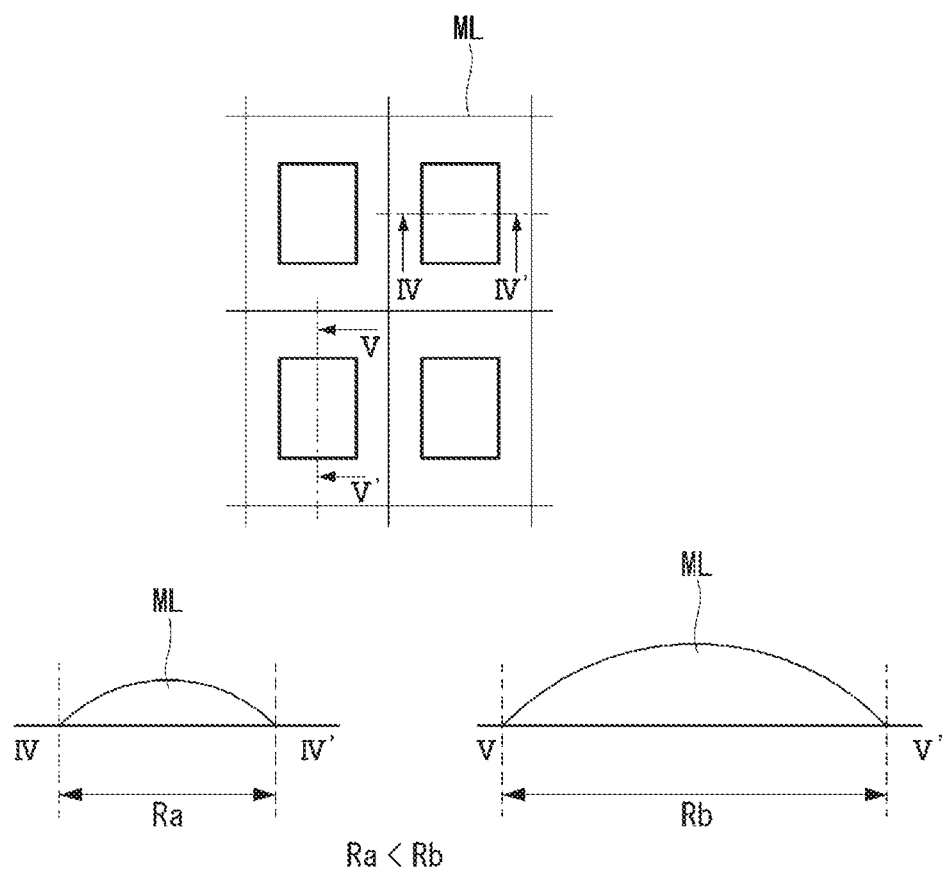

Otherwise, when the emission area has an oblong shape such as rectangular or ellipse shape, an asymmetric micro lens would be applied for the micro deflector ML. FIGS. 7A and 7B are drawings illustrating the shape of the micro deflector disposed on the display panel for a personal immersion apparatus, according to the second embodiment of the present disclosure. FIG. 7A illustrates one example of the symmetric type micro deflector. FIG. 7B illustrates another example of the asymmetric type micro deflector.

Referring to FIG. 7A, the emission areas EA having a regular rhombus shape and/or a circle shape are arrayed with the regular intervals. In this case, the micro deflector ML may have any one shape of the circle, the square or a regular diamond. In the cross sectional view, the micro deflector ML has a symmetric shape. Comparing the cross sectional view along to the line II-II' with the cross sectional view along to the line III-III', the widths Ra and Rb of the micro deflector ML are same.

Referring to FIG. 7B, the emission area EA may have the oblong rectangular shape. The micro deflector ML covering the emission area EA also may have the oblong rectangular shape. Comparing the cross sectional view along to line IV-IV' with the cross sectional view along to line V-V', the width Ra of the micro deflector ML is different from the width Rb of the micro deflector ML.

In FIG. 7A, the micro deflectors ML are arrayed with a regular interval. However, the micro deflectors ML may be arrayed in close contact with each other. In that case, the micro deflectors ML may cover more area of the non-emission area BA. As shown in FIG. 7A, even though the micro deflectors ML are disposed in close contact with each other, when it has the circle shape, there are empty space between the micro deflectors ML. On the contrary, as shown in FIG. 7B, when the micro deflectors ML have any one of the rectangular shape, the square shape or the diamond shape, there may be no empty space between the micro deflectors ML. Without empty space (or interval gap) between micro deflectors ML, more amount of lights scattered and undetected at the non-emission area BA would be refracted or deflected to the normal direction, so that more lights would be detected or recognized by user.

<Third Embodiment>

Figure 8:
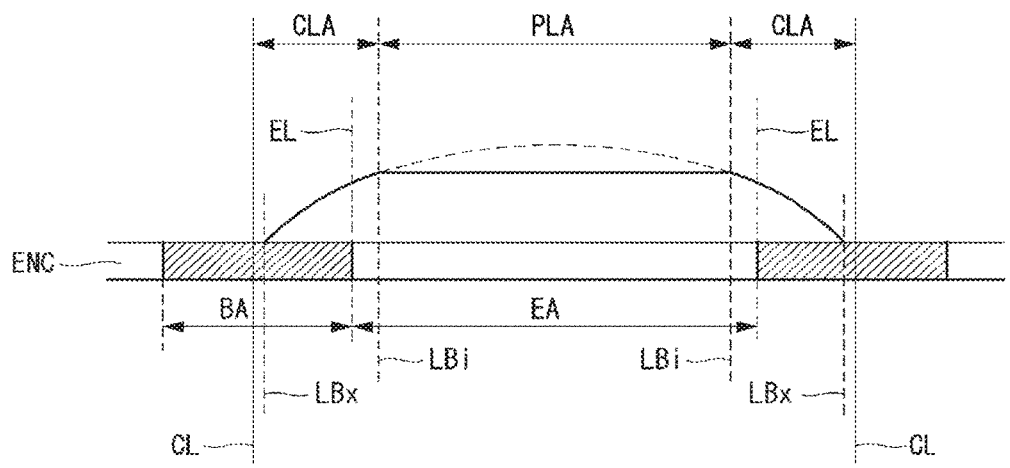
FIG. 8 is a cross sectional view illustrating a micro deflector having a non-spherical lens shape included in the display panel for a personal immersion apparatus, according to a third embodiment of the present disclosure.

Referring to FIG. 8, we will explain about the case in which the micro deflector has a non-spherical lens shape. FIG. 8 is a cross sectional view illustrating a micro deflector having a non-spherical lens shape included in the display panel for a personal immersion apparatus, according to the third embodiment of the present disclosure.

The micro deflector ML is an element configured to deflect and/or refract the scattered lights into the non-emission area BA among the lights radiated from the emission area EA to the normal direction with respect to the surface of the display panel PNL. Therefore, just deflecting or refracting the lights radiated from the emission area EA to the non-emission area BA at the edge line EL to the normal direction, the emission area EA may be magnified effectively.

In detail, the micro deflector ML according to the third embodiment of the present disclosure includes a plane portion PLA and a curved portion CLA. The plane portion PLA is preferably the middle portion of the micro deflector ML, and the curved portion CLA is preferably the circumference portion of the micro deflector ML. Specifically, the curved portion CLA is preferably disposed between the maximum rim LBx defining the maximum size of the micro deflector ML and the minimum rim LBi defining the minimum size of the micro deflector ML. The plane portion PLA is preferably disposed between the two facing minimum rims LBi. As the minimum rim LBi is apart from the edge line EL of the emission area EA into the inner area of the emission area EA, the lights scattered from the emission area EA to the non-emission area BA at the edge line EL would be refracted or deflected to the normal direction with respect to the display panel.

The minimum rim LBi may be set as being aligned with the edge line EL of the emission area EA. Considering the efficiency for refracting or deflecting the lights from emission area EA to the non-emission area BA, it is preferable that the minimum rim LBi is apart from the edge line EL of the emission area EA into the inner area of the emission area EA. It is preferable that the predetermined distance from the edge line EL is corresponding to 5%~10% of the distance between the maximum rim LBx and the edge line EL of the emission area EA.

In the case of the non-spherical lens, the middle portion of the micro deflector ML has a plane shape. Therefore, comparing with the case of the spherical lens, the height of the middle portion is lower. When the flatness of the top surface of the display panel is required, the non-spherical lens is more suitable than the spherical lens for the micro deflector ML.

<Fourth Embodiment>

Figure 9:
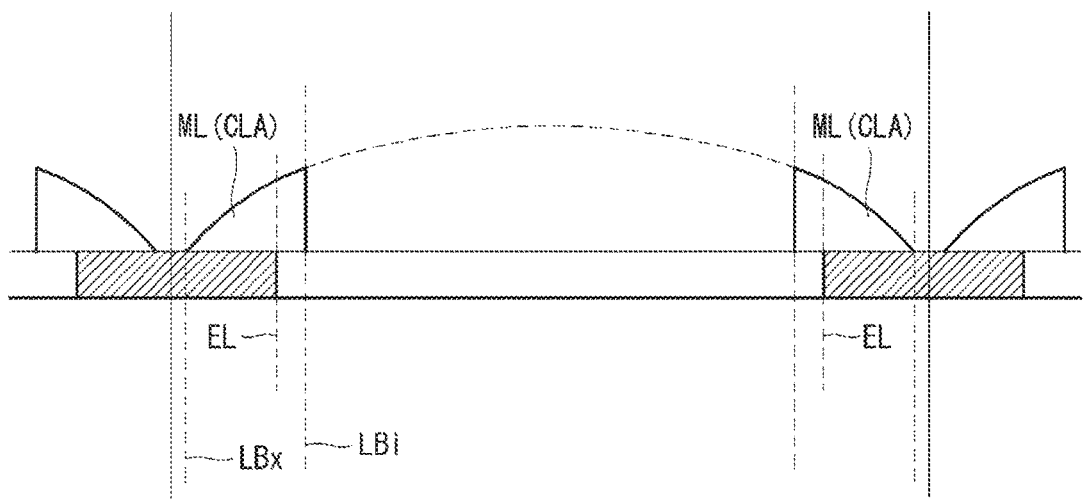
FIG. 9 is a cross sectional view illustrating a micro deflector having a non-spherical lens shape included in the display panel for a personal immersion apparatus, according to a fourth embodiment of the present disclosure.

The fourth embodiment suggests another example in which the non-spherical lens type is applied for the micro deflector. FIG. 9 is a cross sectional view illustrating a micro deflector having a non-spherical lens shape included in the display panel for a personal immersion apparatus, according to the fourth embodiment of the present disclosure.

The micro deflector ML according to the fourth embodiment includes only the curved portion CLA, without the plane portion PLA included in the third embodiment. It is preferable that the curved portion CLA is disposed between the maximum rim LBx and the minimum rim LBi of the micro deflector ML. As the minimum rim LBi is apart from the edge line EL of the emission area EA into the inner area of the emission area EA, the lights scattered from the emission area EA to the non-emission area BA at the edge line EL would be refracted or deflected to the normal direction with respect to the display panel.

The minimum rim LBi may be set as being aligned with the edge line EL of the emission area EA. Considering the efficiency for refracting or deflecting the lights from emission area EA to the non-emission area BA, it is preferable that the minimum rim LBi is apart from the edge line EL of the emission area EA into the inner area of the emission area EA. It is preferable that the predetermined distance from the edge line EL is corresponding to 5%-10% of the distance between the maximum rim LBx and the edge line EL of the emission area EA.

For the micro deflector ML according to the fourth embodiment, there is no lens material at the middle area covering most portions of the emission area EA, but there is only the curved portion CLA over the non-emission area BA. This case may be considered that the center of the micro deflector ML is located at the center of the emission area EA. In this application, the micro deflector ML may be defined as the inner area of the maximum rim LBx surrounding the emission area EA, regardless of existence of the deflector material at the middle portions.

<Fifth Embodiment>

Figure 10:
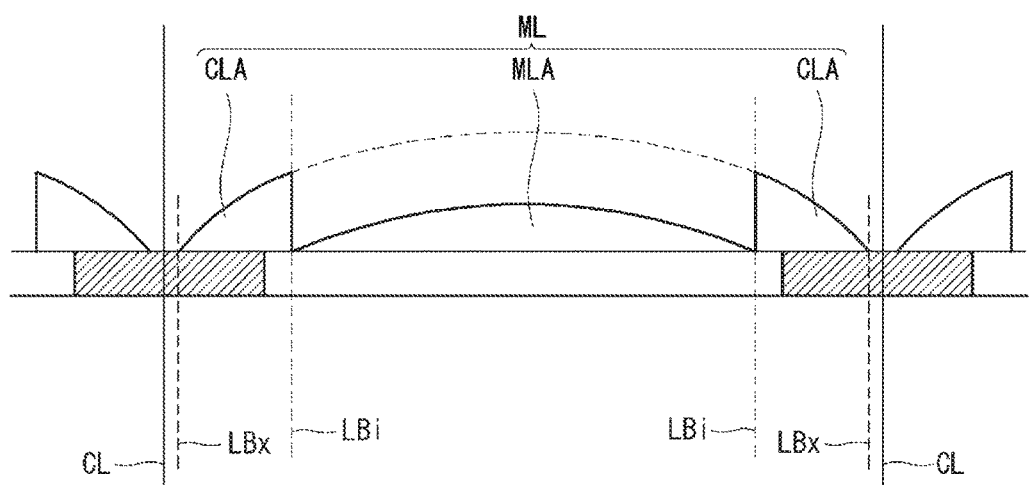
FIG. 10 is a cross sectional view illustrating a micro deflector having the Fresnel lens included in the display panel for a personal immersion apparatus, according to a fifth embodiment of the present disclosure.

In the fifth embodiment, we suggest an exemplary micro deflector in which the height of the middle portion is not higher than the circumference portion even though a spherical lens is applied. FIG. 10 is a cross sectional view illustrating a micro deflector having the Fresnel lens included in the display panel for a personal immersion apparatus, according to the fifth embodiment of the present disclosure.

In the fifth embodiment, the micro deflector ML includes a Fresnel lens one of flat type lens having the optical property of the spherical lens without thicker thickness at the middle portion. In detail, the micro deflector ML according to the fifth embodiment includes a middle curved portion MLA and a curved portion CLA. The middle curved portion MLA may be a convex lens disposed at the middle portions of the micro deflector ML. The middle curved portion MLA is disposed between two facing minimum rims LBi of the emission area EA. The middle curved portion MLA may have the same curvature with that of the micro deflector ML according to the first embodiment.

The curved portion CLA is preferably the circumference portion of the micro deflector ML. Specifically, the curved portion CLA is preferably disposed between the maximum rim LBx defining the maximum size of the micro deflector ML and the minimum rim LBi defining the minimum size of the micro deflector ML. As the minimum rim LBi is apart from the edge line EL of the emission area EA into the inner area of the emission area EA, the lights scattered from the emission area EA to the non-emission area BA at the edge line EL would be refracted or deflected to the normal direction with respect to the display panel.

The minimum rim LBi may be set as being aligned with the edge line EL of the emission area EA. Considering the efficiency for refracting or deflecting the lights from emission area EA to the non-emission area BA, it is preferable that the minimum rim LBi is apart from the edge line EL of the emission area EA into the inner area of the emission area EA. It is preferable that the predetermined distance from the edge line EL is corresponding to 5%~10% of the distance between the maximum rim LBx and the edge line EL of the emission area EA.

In the case that the micro deflector ML is applied with the Fresnel lens type, the height of the middle portion is not higher than that of the micro deflector of the first embodiment. Therefore, when the flatness of the display panel is required, it is preferable that the Fresnel type micro deflector ML would be more preferable.

<Sixth Embodiment>

Referring to the fourth and fifth embodiments, the micro deflectors ML have a structure in which the curved portion CLA is separated from the plane portion PLA or the middle curved portion MLA. In the view point of the emission area EA, the curved portion CLA is disposed at the circumferences of the micro deflector ML. However, in the view point of the non-emission area BA, two curved portions CLA of the two neighboring micro deflector ML are formed one micro deflector.

Figure 11:
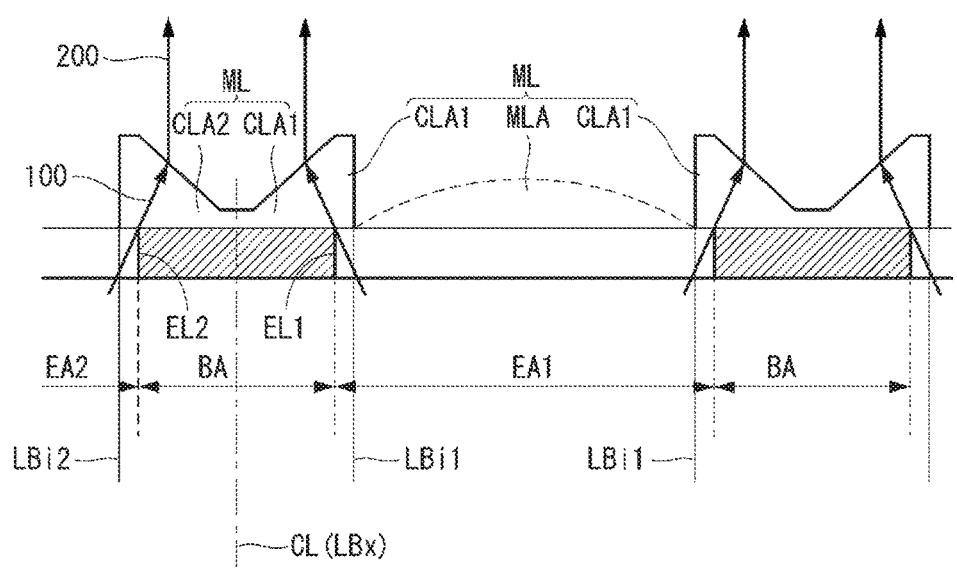
FIG. 11 is a cross sectional view illustrating a micro deflector having the prism shape included in the display panel for a personal immersion apparatus, according to a sixth embodiment of the present disclosure.

Referring to FIG. 11, we will explain about the sixth embodiment in which a prism type micro deflector ML is disposed at the non-emission area BA. FIG. 11 is a cross sectional view illustrating a micro deflector having the prism shape included in the display panel for a personal immersion apparatus, according to the sixth embodiment of the present disclosure.

The micro deflector ML according to the sixth embodiment may have a prism disposed at the non-emission area BA between two neighboring emission areas, a first emission area EA1 and the second emission area EA2. For example, it is preferable that the micro deflector ML is disposed at the area between the first minimum rim LBi1 defined at the first emission area EA1 and the second minimum rim LBi2 defined at the second emission area EA2. Specifically, the micro deflector ML may be a prism corresponding to a triangular shape in which the minimum height is disposed at the center line CL and the maximum height is disposed at each edge lines EL1 and EL2 of the first emission area EA1 and the second emission area EA2, respectively.

As the first minimum rim LBi1 is apart from the first edge line EL1 of the first emission area EA1 into the inner area of the first emission area EA1, the lights scattered from the first emission area EA1 to the non-emission area BA at the first edge line EL1 would be refracted or deflected to the normal direction with respect to the display panel. Similarly, As the second minimum rim LBi2 is apart from the second edge line EL2 of the second emission area EA2 into the inner area of the second emission area EA2, the lights scattered from the second emission area EA2 to the non-emission area BA at the second edge line EL2 would be refracted or deflected to the normal direction with respect to the display panel.

In the sixth embodiment, there may be no lens material at the most portions of the emission area EA, i.e., the portions surrounded by the first minimum rim LBi1. In that case, the micro deflector ML includes a first curved portion CLA1 closed to the first emission area EA1 and a second curved portion CLA2 closed to the second emission area EA2. Here, it may be considered as the micro deflector ML is disposed based on the non-emission area BA. Then, the center of the micro deflector ML may be aligned on the center line CL, the center of the non-emission area BA.

For another example, a convex lens further included like the middle curved portion MLA drawn in a dotted line as shown in FIG. 11. This convex lens may have the same curvature with that of the fifth embodiment and be disposed at the same position. In that case, the micro deflector ML comprises a first curved portion CLA1 disposed at the non-emission area BA surrounding the first emission area EA1 and a middle curved portion MLA disposed at the middle area of the first emission area EA1. In that case, it may be considered as the center point of the micro deflector ML is aligned at the center of the emission area EA.

<Seventh Embodiment>

Until now we have explained about the array structure of the micro deflector in which one micro deflector is disposed in one emission area. When the emission area has an oblong shape or the non-emission area has long band shape in which one side is very narrow and other side is very wide, the micro deflector ML may have a shape covering the several emission areas disposed in a row direction or column direction sequentially.

Figure 12:
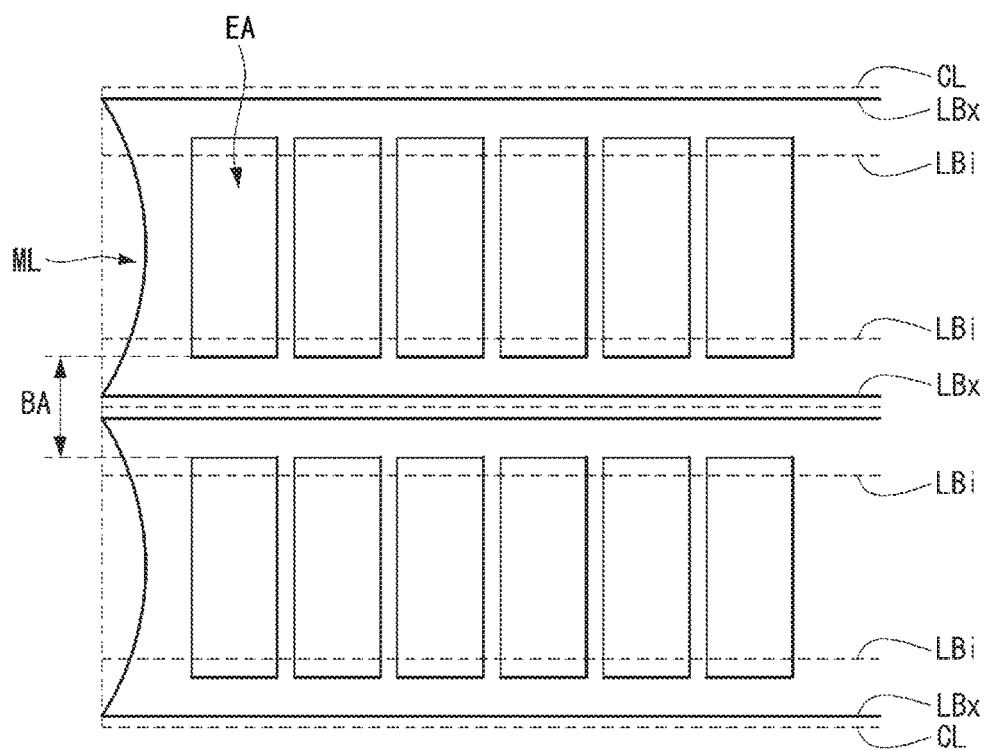
FIG. 12 is a cross sectional view illustrating an examplary shape of a micro deflector included in the display panel for a personal immersion apparatus, according to a seventh embodiment of the present disclosure.

FIG. 12 is a cross sectional view illustrating an examplary shape of a micro deflector included in the display panel for a personal immersion apparatus, according to the seventh embodiment of the present disclosure. For convenience, FIG. 12 shows a structure of the micro deflector ML covering a plurality of emission areas arrayed in a row direction. For other example, the micro deflector ML may have the shape covering a plurality of emission areas arrayed in a column direction.

Referring to FIG. 12, among a plurality of the emission areas, the non-emission area along to the row direction has very narrow intervals, but the non-emission area along to the column direction has very wide intervals. In this case, by refracting or deflecting the lights radiated to the non-emission areas disposed along to column direction of the pixel area to the normal direction with respect to the surface of the display panel, it may be enough to reduce the screen door effect. Therefore, it is preferable that the micro deflector has a half cylindrical shape running to the row direction.

In that case, the center line CL may be set on the middle portion between any one row of the emission area EA and upper neighboring row of emission area EA or lower neighboring row of emission area EA. Further, the maximum rim LBx of the micro deflector may be set on between the center line CL and the upper edge line of any one row of the emission area EA, and/or between the center line CL and the lower edge line of the row of the emission area EA. The minimum rim LBi may be set as being apart with a predetermined distance to the emission area EA, from upper edge line of any one row of the emission area EA, and/or from lower edge line of the row emission area EA.

By the half cylindrical shaped micro deflector ML, the lights emitted from any one row of the emission areas EA to the non-emission area BA would be refracted and/or deflected to the normal direction with respect to the surface of the display panel. The actual area of any one row of the emission areas EA is not changed but its image provided to the user would be magnified by the micro deflector ML. As the results, the effect of improved aperture ratio would be acquired and the screen door effect would be reduced.

<Eighth Embodiment>

Figure 13:
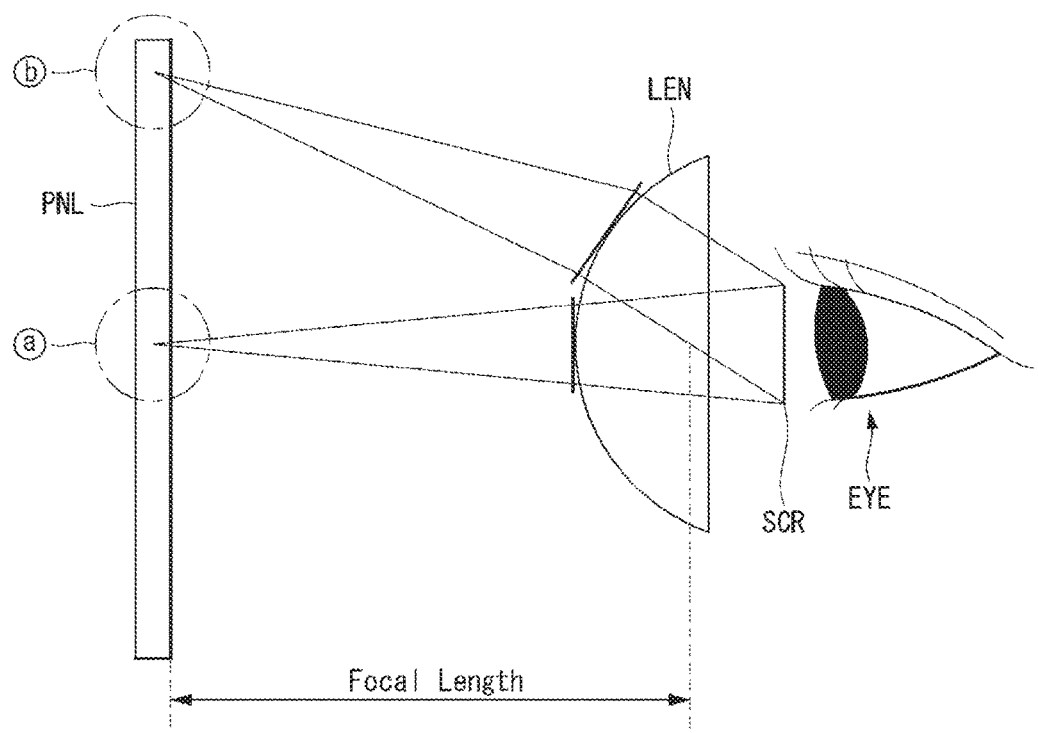
FIG. 13 is a cross sectional view illustrating a relationship between a micro deflector and an imaging lens included in the display panel for a personal immersion apparatus, according to an eighth embodiment of the present disclosure.

Until now, we have explained various embodiments focused on the feature of the micro deflectors ML, based on the microscopic viewpoint. Hereinafter, we will explain the features of the micro deflector ML according to the eighth embodiment, based on the macroscopic viewpoint. FIG. 13 is a cross sectional view illustrating a relationship between a micro deflector and an imaging lens included in the display panel for a personal immersion apparatus, according to the eighth embodiment of the present disclosure.

The display panel for the personal immersion apparatus according to the present disclosure comprises a first display panel PNL1 corresponding to the left eye of user and a second display panel PNL2 corresponding to the right eye of user. Each display panels PNL1 and PNL2 have larger size than the left eye and the right eye of a user, respectively. Even though the display panels PNL1 and PNL2 are close to the user's eyes, the images provided from the display panels PNL1 and PNL2 may not cover full viewing range of the user's eye. To fully cover the viewing range of the user's eye, the imaging lenses may be applied. In the eighth embodiment, we will explain about the structure for ensuring the superior efficiency of lights of the images provided from the display panel when the images are magnified to cover the viewing range of the user's eye and more. In FIG. 13 and the figures that follow, for convenience, we will use single display panel PNL, single user eye EYE, and single imaging lens LEN.

The display for the personal immersion apparatus according to the present disclosure comprises a display panel PNL and an imaging lens LEN. The imaging lens LEN may be disposed between the display panel PNL and the user eye EYE. Preferably, the imaging lens LEN is apart from the display panel PNL with a focal length of the imaging lens LEN. The lights of images radiated from the display panel PNL is provided to the screen SCR of user eye EYE through the imaging lens LEN.

The display panel PNL for the personal immersion apparatus includes a plurality of pixel areas PA. Each of pixel areas PA includes an emission area EA and a non-emission area BA. Further, one micro deflector ML is disposed at each of emission area EA. Here, we explain about the display for the personal immersion apparatus having a display panel PNL according to the first embodiment. However, the display panels PNL according to the other embodiments would be applied to the display for the personal immersion apparatus.

Until now, in convenience, we have explained that the lights radiated from the display panel PNL are considered as propagating to the normal direction with respect to the surface of the display panel PNL. It is considered that the display panel PNL is apart from the user with very long distance. However, for the personal immersion apparatus, the distance between the display panel PNL and the user is very close. Therefore, all lights radiated from the display panel PNL do not propagate to the normal direction to the surface of the display panel PNL.

The lights radiated at the middle portions of the display panel PNL like â area as shown in FIG. 13 may propagate along to the horizontal direction, may be focused by the center portions of the imaging lens LEN and then be provided to the screen SCR of eye from the frontal direction. In the interim, the lights radiated at the circumference portions of the display panel PNL like b̂ area as shown in FIG. 13 may propagate along to the inclined direction with respect to the horizontal direction, may be focused by the circumference portions of the imaging lens LEN and then be provided to the screen SCR of eye from the lateral direction.

The size of the image provided by the display panel PNL is optically controlled by the imaging lens LEN. In the view point of the optics, each of the points for providing the lights at the surface of the display panel PNL is corresponding to each of the points at the curved surface of the imaging lens LEN, with the one-to-one correspondence. For example, the center point of the display panel PNL is corresponding to the center point of the curved surface of the imaging lens LEN. The upper end point of the display panel PNL is corresponding to the upper end point of the curved surface of the imaging lens LEN. Further, the lower end point of the display panel PNL is corresponding to the lower end point of the curved surface of the imaging lens LEN.

When connecting each point of the display panel PNL to each of the curved surface of the imaging lens LEN according to the one-to-one correspondence, the light path at the middle portion is not parallel with the light path at the circumference portion, as shown in FIG. 13. In other words, the line connecting the center point of the display panel PNL to the center point of the imaging lens LEN would be the horizontal line. The line connecting any one edge point of the display panel PNL to any one edge point of the imaging lens LEN would be an inclined line not parallel to the horizontal line.

Figure 14A:
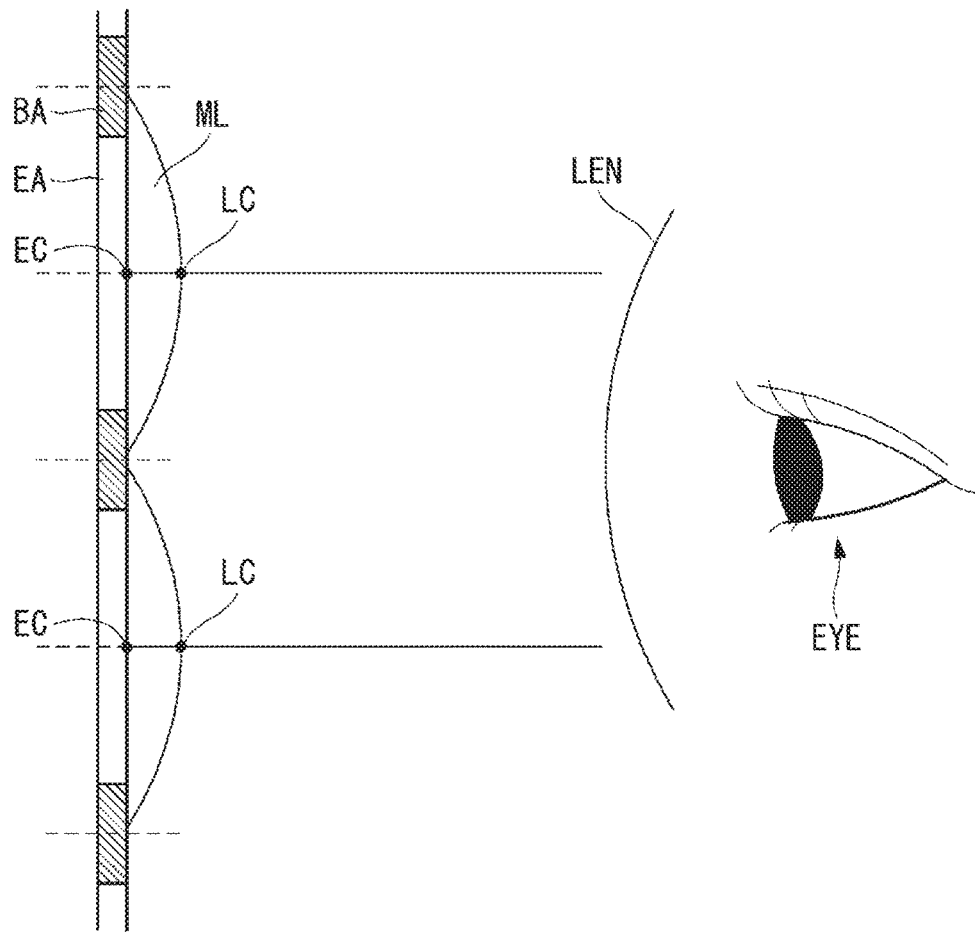
FIG. 14A is a cross sectional view illustrating a structure of a micro deflector disposed in the middle portion of the display panel, in accordance with one or more embodiments.
Figure 14B:
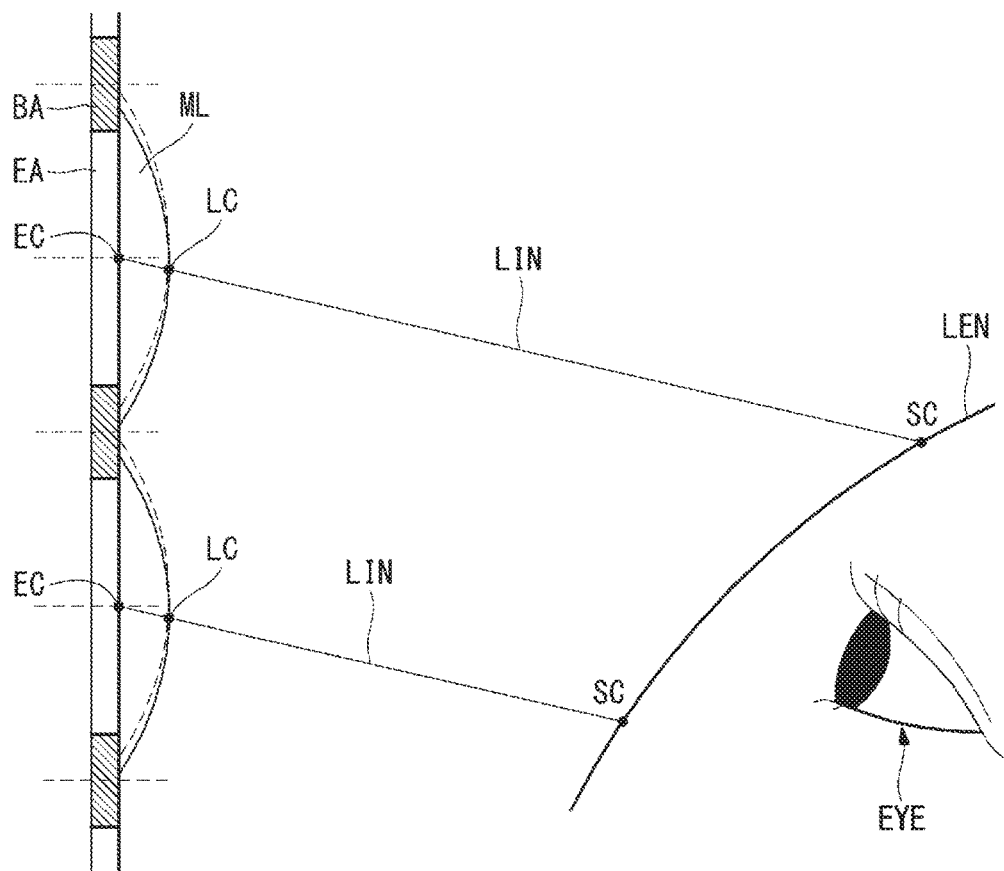
FIG. 14B is a cross sectional view illustrating a structure of a micro deflector disposed at the circumferential portion of the display panel, in accordance with one or more embodiments.

Considering these light paths, the arrangement of the micro deflector ML disposed at the middle portion of the display panel PNL may be different from the arrangement of the micro deflector ML disposed at the circumference portion. FIG. 14A is a cross sectional view illustrating a structure of a micro deflector ML disposed in the middle portion of the display panel, the â area in FIG. 13. FIG. 14B is a cross sectional view illustrating a structure of a micro deflector ML disposed at the circumferential portion of the display panel, the b̂ area in FIG. 13.

At first referring to FIG. 14A, we will explain about the arrangement of the micro deflector at the â area in FIG. 13. The light from the center point of the display panel PNL propagates to the user's eye along to the frontal direction. That is, the user would see the lights radiated along to the normal direction with respect to the surface of the display panel PNL. Therefore, it is preferable that the micro deflectors ML disposed at the middle portion of the display panel PNL are arrayed as being exactly aligned to the emission area EA. In detail, it is preferable that the center point LC of the micro deflector ML is aligned to the center point EC of the emission area EA.

Next, referring to FIG. 14B, we will explain about the arrangement of the micro deflector at the b̂ area in FIG. 13. The light from the circumferential point of the display panel PNL propagates to the user's eye EYE along to the inclined direction to the horizontal line. Therefore, it is preferable that the micro deflectors ML disposed at the circumferential portion of the display panel PNL are arrayed as being slightly misaligned to the emission area EA. In detail, it is preferable that the center point LC of the micro deflector ML is aligned to an extended line LIN linking the center point EC of the emission area EA to the corresponding point SC of the curved surface of the imaging lens LEN.

As the result, at the middle portion of the display panel PNL, the pitch of the micro deflectors ML would preferably be exactly matched with the pitch of the emission areas EA. On the contrary, at the circumferential portion of the display panel PNL, the pitch of the micro deflectors ML would preferably be slightly different from the pitch of the emission areas EA. Specifically, the misaligned amount is more increased as being apart from the center portion to the circumferential portion. In other words, at the middle portion of the display panel PNL, it is preferable that the center point LC of the micro deflector ML is aligned or matched to the normal direction with respect to the surface of the display panel PNL. In the interim, at the up side, the low side, the left side and the right side of the display panel PNL, the center point LC of the micro deflector ML is shifted to the center of the display panel PNL.

By selectively misaligning the micro deflector ML to the emission area EA, the display for the personal immersion apparatus according to the eighth embodiment would have the optimized brightness or luminance distribution. Unlike the general purpose displays, for the display for the personal immersion apparatus, the display panel is close to the user's eye. Therefore, the lights of the images provided on the display panel are not parallel each other, but the lights are converged onto the eye. Therefore, aligning the centers of the micro deflectors to the converged light paths from the points of the display panel to the user's eye, the luminance distribution of the display would be optimized and maximized. For the images provided from the display according to the present disclosure, the emission areas are magnified but the non-emission areas are scaled-down. By differing or controlling the alignments of the micro deflectors, the area ratio of the emission area in the pixel area would be maximized and/or optimized.

<Ninth Embodiment>

Hereinbefore, we have explained about the structure and/or arrangement of the micro deflectors ML. In the ninth and tenth embodiments, we will explain about the various types of the organic light emitting diode display for the display panel. In the embodiments of the present disclosure, the organic light emitting diode display panel is suitable because it has the high response speed and the high driving speed and it is easy to form an ultra thin display panel. However, the features of the present disclosure may be applied to other types of the flat display panel including the liquid crystal display and the electrophoresis display.

Figure 15:
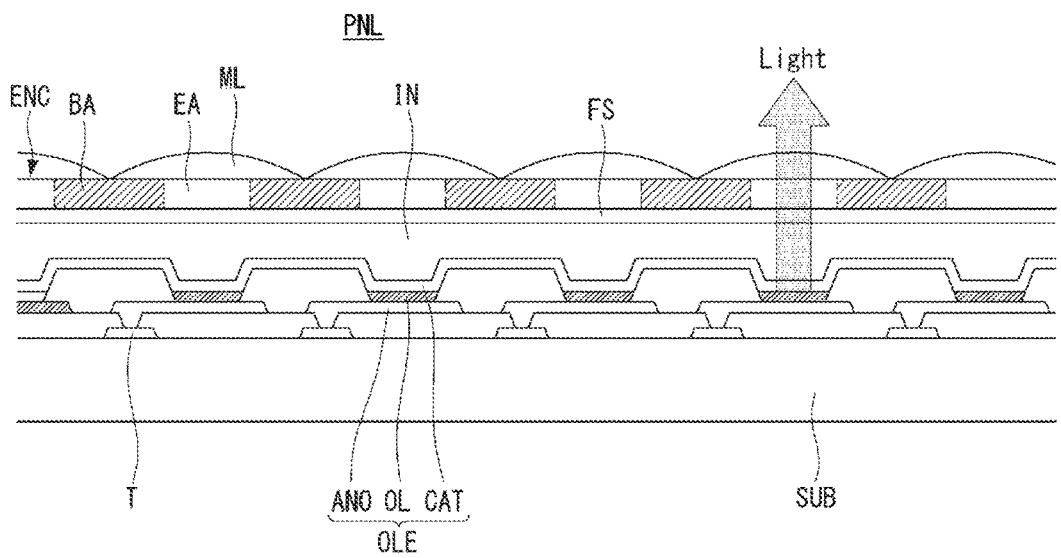
FIG. 15 is a cross sectional view illustrating a disposition structure of a micro deflector in in the display panel for a personal immersion apparatus using a top emission type organic light emitting diode display panel according to a ninth embodiment.

FIG. 15 is a cross sectional view illustrating a disposition structure of a micro deflector in in the display panel for a personal immersion apparatus using a top emission type organic light emitting diode display panel according to the ninth embodiment.

For the top emission type, the organic light emitting diode panel PNL is manufactured as that the thin film transistor T is formed on a substrate SUB and formed the organic light emitting diode OLE thereon, then the top surface of the substrate SUB is sealed with an en-cap substrate ENC. The light generated at the organic light emitting diode OLE is radiated through the en-cap substrate ENC. The organic light emitting diode OLE may include an anode electrode ANO connected to the thin film transistor T, an organic light emitting layer OL stacked on the anode electrode ANO and a cathode electrode CAT stacked on the organic light emitting layer OL. Here, the top emission type means that the lights from the organic light emitting layer OL are propagated to the cathode electrode CAT. In this case, it is preferable that the anode electrode ANO has a reflection conductive material and the cathode electrode CAT has a transparent conductive material.

When applying the micro deflector ML to the top emission type organic light emitting diode display, it is preferable that the micro deflectors ML are disposed on the surface where the lights are radiated out. For example, the micro deflectors ML may be directly formed on the outer surface of the en-cap substrate ENC, or a lens film having the micro deflectors ML may be attached on the outer surface of the en-cap substrate ENC. Otherwise, the micro deflectors ML may be directly formed or a lens film having the micro deflectors ML may be attached, on the inner surface of the en-cap substrate ENC. In some cases, the color filter and/or the black matrix would be further disposed on the inner or outer surface of the en-cap substrate ENC. In these cases, the color filters would be aligned with the emission area EA and the black matrix would be aligned with the non-emission area BA. Further, it is preferable that the micro deflectors ML are formed as corresponding to the color filters.

For other example, the micro deflector ML may be directly formed or the lens film having the micro deflector ML may be attached on the upper surface of the substrate, before joining the en-cap substrate ENC. With a face sealant FS, the en-cap substrate ENC may be joined with the substrate SUB. In order to planarize the top surface of the face sealant FS, an insulating planar layer IN may be disposed on the upper surface of the substrate SUB. In that case, the micro deflector ML may be formed by directly patterning the insulating planar layer IN. Otherwise, the micro deflector ML may be formed by depositing and patterning a material for micro deflector ML on the insulating planar layer IN.

FIG. 15 shows that the micro deflectors ML are formed on the outer surface of the en-cap substrate ENC. Further, inside of the en-cap substrate ENC, the emission area EA and the non-emission area BA are disposed. FIG. 15 may be the actual structure of the en-cap substrate ENC. However, FIG. 15 just shows that the ranges of the emission area EA and the non-emission area BA. Further, the color filter and the black matrix may be disposed on the outer or inner surface of the en-cap substrate ENC. Here, the organic light emitting layers OL are separately disposed in each of the emission area EA. In this case, each of the organic light emitting layer OL may include an organic material emitting any one of the red color, the green color, the blue color and/or the white color. When applying the color filters, the organic light emitting layer OL may be deposited as covering whole surface of the substrate SUB continuously.

<Tenth Embodiment>

Figure 16:
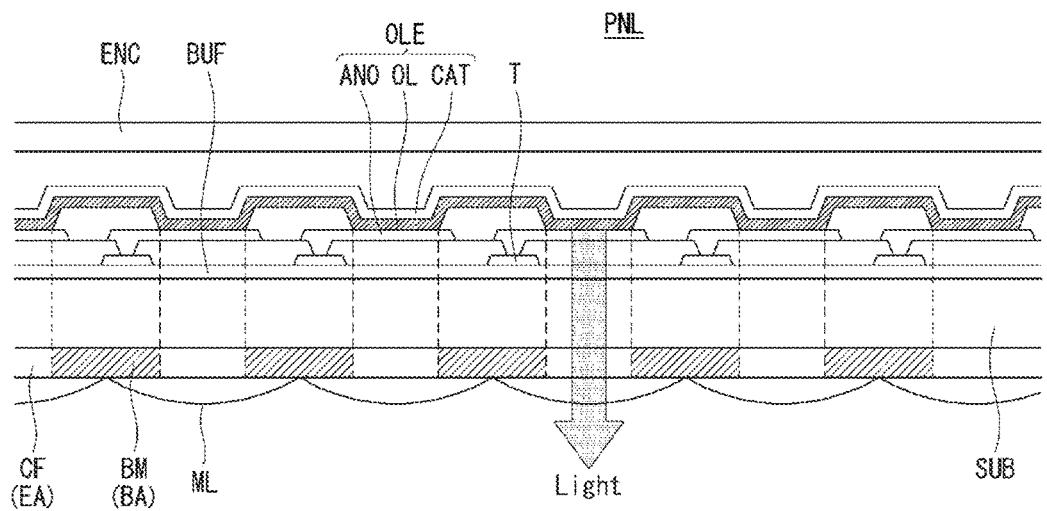
FIG. 16 is a cross sectional view illustrating a disposition structure of a micro deflector in in the display panel for a personal immersion apparatus using a bottom emission type organic light emitting diode display panel according to a tenth embodiment.

FIG. 16 is a cross sectional view illustrating a disposition structure of a micro deflector in in the display panel for a personal immersion apparatus using a bottom emission type organic light emitting diode display panel according to the tenth embodiment.

For the bottom emission type, the organic light emitting diode panel PNL is manufactured as that the thin film transistor T is formed on a substrate SUB and formed the organic light emitting diode OLE thereon, then the top surface of the substrate SUB is sealed with an en-cap substrate ENC. The light generated at the organic light emitting diode OLE is radiated through the substrate SUB. The organic light emitting diode OLE may include an anode electrode ANO connected to the thin film transistor T, an organic light emitting layer OL stacked on the anode electrode ANO and a cathode electrode CAT stacked on the organic light emitting layer OL. Here, the bottom emission type means that the lights from the organic light emitting layer OL are propagated to the anode electrode ANO. In that case, it is preferable that the anode electrode ANO has a transparent conductive material and the cathode electrode CAT has a reflection conductive material.

When applying the micro deflector ML to the bottom emission type organic light emitting diode display, it is preferable that the micro deflectors ML are disposed on the surface where the lights are radiated out. For example, the micro deflectors ML may be directly formed on the outer surface of the substrate SUB, or a lens film having the micro deflectors ML may be attached on the outer surface of the substrate SUB. Otherwise, the micro deflectors ML may be directly formed or a lens film having the micro deflectors ML may be attached, on the inner surface of the substrate SUB. For another example, before forming the thin film transistor T, a buffer layer BUF is firstly deposited on the inner surface of the substrate SUB. In this process, by directly patterning the buffer layer BUF, the micro deflectors ML may be formed. Otherwise, before depositing the buffer layer BUF, a deflector material is deposited and patterned to form the micro deflectors ML. After that, the buffer layer BUF may be deposited on the micro deflectors ML.

In some cases, the color filter and/or the black matrix would be further disposed on the inner or outer surface of the substrate SUB. In those cases, the color filters would be aligned with the emission area EA and the black matrix would be aligned with the non-emission area BA. Further, it is preferable that the micro deflectors ML are formed as corresponding to the color filters.

FIG. 15 shows that the organic light emitting layer OL is disposed as covering the whole surface of the substrate SUB. In this case, the color filter CF is required. Therefore, the color filter CF and the black matrix BM are disposed on the outer surface of the substrate SUB. Otherwise, the color filter CF and the black matrix BM are disposed on the inner surface of the substrate SUB. For other example, as shown in FIG. 15, the organic light emitting layer OL is formed at each emission area EA, individually. In that case, the color filter CF may be further included for enhancing the color quality. Otherwise, without color filter CF, a transparent resin material may be disposed at the emission area EA and a black resin material may be disposed at the non-emission area BA. 162.

While the embodiment of the present disclosure has been described in detail with reference to the drawings, it will be understood by those skilled in the art that the disclosure can be implemented in other specific forms without changing the technical spirit or essential features of the disclosure. Therefore, it should be noted that the forgoing embodiments are merely illustrative in all aspects and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display for a personal immersion apparatus comprising:
   an imaging lens; and
   a display panel, the display panel including:
      a substrate;
      a plurality of pixel areas disposed on the substrate;
      an emission area defined in each of the pixel areas;
      a non-emission area surrounding the emission area in each of the pixel areas; and
      a micro deflector covering the emission area and at least a part of the non-emission area of a corresponding pixel area, the micro deflector configured to deflect light scattered into the non-emission area from the emission area to a normal direction with respect to a surface of the substrate, and to provide the deflected lights to the imaging lens,
   wherein the imaging lens is spaced apart from the display panel by a focal length of the imaging lens.

2. The display according to the claim 1, wherein the emission area is provided to the imaging lens as a magnified image by the micro deflector, and
   wherein the non-emission area is provided to the imaging lens as a scaled-down image by the micro deflector.

3. The display according to the claim 1, wherein the micro deflector includes:
   a minimum rim that is spaced apart from an edge line of the emission area in a direction toward the emission area by a first distance; and
   a maximum rim that is apart from the edge line of the emission area in a direction toward the non-emission area by a second distance.

4. The display according to the claim 3, wherein the maximum rim of the micro deflector is positioned inside of a middle line that is between the edge line of the emission area and a neighboring edge line of a neighboring emission area, the maximum rim being spaced apart from the middle line by a predetermined distance.

5. The display according to the claim 3, wherein the micro deflector includes a transparent material having a profile in which a thickness of the micro deflector gradually decreases from the minimum rim to the maximum rim.

6. The display according to the claim 3, wherein the micro deflector includes a convex lens disposed at an inner area surrounded by the maximum rim.

7. The display according to the claim 3, wherein the micro deflector includes an outer convex lens disposed between the minimum rim and the maximum rim.

8. The display according to the claim 7, wherein the micro deflector further includes an inner convex lens disposed at an inner area surrounded by the minimum rim.

9. The display according to the claim 7, wherein the micro deflector further includes a planar portion disposed at an inner area surrounded by the minimum rim.

10. The display according to the claim 3, wherein the micro deflector is disposed between a first minimum rim of a first emission area and a second minimum rim of a second emission area neighboring the first emission area, and
    wherein the micro deflector has a maximum thickness at the first minimum rim and at the second minimum rim, and a minimum thickness at a middle portion between the first and the second minimum rims.

11. The display according to the claim 1, wherein the micro deflector has a half cylindrical shape having a length that extends in a first direction over at least one of a row and a column of an array of the pixel areas, and a diameter that extends in a second direction over at least one of a length and a width of one of the pixel areas.

12. The display according to the claim 1, wherein the micro deflector includes:
    a first micro deflector disposed at a middle portion of the substrate; and
    a second micro deflector disposed adjacent to a circumferential portion of the substrate,
    wherein a center point of the first micro deflector is aligned to a first center point of a first emission area, and
    wherein a center point of the second micro deflector is aligned to an extended line from a second center point of a second emission area to a corresponding point on the imaging lens.

13. The display according to the claim 1, wherein the display panel includes:
    an anode electrode disposed on the display panel, the anode electrode including a reflection conductive material;
    an organic light emitting layer disposed on the anode electrode corresponding to the emission area; and
    a cathode electrode disposed on the organic light emitting layer, the cathode electrode including a transparent conductive material,
    wherein the micro deflector is disposed on the cathode electrode.

14. The display according to the claim 1, wherein the display panel includes:
    an anode electrode disposed on the display panel, the anode electrode including a transparent conductive material;
    an organic light emitting layer disposed on the anode electrode corresponding to the emission area; and
    a cathode electrode disposed on the organic light emitting layer, the cathode electrode including a reflection conductive material,
    wherein the micro deflector is disposed under the anode electrode.

15. The display according to the claim 1, wherein the display panel includes:
    a first display panel including a first display area having a first center point; and
    a second display panel including a second display area having a second center point,
    wherein the first center point of the first display area and the second center point of the second display area are spaced apart from one another by a distance corresponding to an inter pupillary distance of a user.

16. The display according to the claim 15, wherein the first display area and the second display area are disposed separately on the same substrate.

17. A display for a personal immersion apparatus comprising:
an imaging lens; and
a display panel, the display panel including:
a substrate;
a plurality of pixel areas disposed on the substrate;
an emission area defined in each of the pixel areas;
a non-emission area surrounding the emission area in each of the pixel areas; and
a micro deflector configured to deflect light scattered into the non-emission area from the emission area to a normal direction with respect to a surface of the substrate, and to provide the deflected lights to the imaging lens,
wherein the imaging lens is spaced apart from the display panel by a focal length of the imaging lens,
wherein the micro deflector includes:
a minimum rim that is spaced apart from an edge line of the emission area in a direction toward the emission area by a first distance; and
a maximum rim that is apart from the edge line of the emission area in a direction toward the non-emission area by a second distance,
wherein the micro deflector is disposed between a first minimum rim of a first emission area and a second minimum rim of a second emission area neighboring the first emission area, and
wherein the micro deflector has a maximum thickness at the first minimum rim and at the second minimum rim, and a minimum thickness at a middle portion between the first and the second minimum rims.

18. The display panel of claim 17, wherein the imaging lens is a fisheye lens configured to receive light from each of the plurality of pixel areas.

19. The display panel of claim 1, wherein the display panel includes an encapsulant on the substrate and covering the plurality of pixel areas, the micro deflector is disposed directly on the encapsulant, and the imaging lens is spaced apart from the micro deflector.

20. The display device according to claim 1, wherein the imaging lens is a fisheye lens configured to receive light from each of the plurality of pixel areas.

* * * * *